(12) United States Patent
Takemoto et al.

(10) Patent No.: US 8,358,708 B2
(45) Date of Patent: Jan. 22, 2013

(54) LOW OFFSET INPUT CIRCUIT AND TRANSMISSION SYSTEM WITH THE INPUT CIRCUIT

(75) Inventors: Takashi Takemoto, Kokubunji (JP); Hiroki Yamashita, Hachioji (JP); Masayoshi Yagyu, Hanno (JP)

(73) Assignee: Hitachi, Ltd., Tokyo (JP)

( * ) Notice: Subject to any disclaimer, the term of this patent is extended or adjusted under 35 U.S.C. 154(b) by 794 days.

(21) Appl. No.: 12/453,980

(22) Filed: May 28, 2009

(65) Prior Publication Data
US 2009/0304092 A1 Dec. 10, 2009

(30) Foreign Application Priority Data
May 30, 2008 (JP) ................................. 2008-142491

(51) Int. Cl.
*H04L 7/00* (2006.01)
(52) U.S. Cl. ........................................ 375/257; 375/354
(58) Field of Classification Search ........................ None
See application file for complete search history.

(56) References Cited

U.S. PATENT DOCUMENTS

| | | | |
|---|---|---|---|
| 6,968,172 B2 * | 11/2005 | Saito | 455/306 |
| 2003/0112049 A1 * | 6/2003 | Wang | 327/307 |
| 2003/0174079 A1 * | 9/2003 | Soltanian et al. | 341/118 |
| 2006/0067440 A1 | 3/2006 | Hsu et al. | |
| 2006/0186954 A1 * | 8/2006 | Koller et al. | 330/9 |
| 2007/0258546 A1 * | 11/2007 | Smeloy et al. | 375/318 |
| 2009/0146722 A1 * | 6/2009 | Chen et al. | 327/307 |

OTHER PUBLICATIONS

Crawley et al., Design Operational Trans-Conductance Amplifiers for Low Voltage Operation, May 1993, IEEE.*

* cited by examiner

*Primary Examiner* — David C. Payne
*Assistant Examiner* — Wednel Cadeau
(74) *Attorney, Agent, or Firm* — Stites & Harbison, PLLC; Juan Carlos A. Marquez, Esq.

(57) ABSTRACT

A low offset input circuit and a signal transmission system which can accommodate a high-speed interface and achieve reduction of an offset voltage are provided. An offset voltage compensating circuit block 103 having an input circuit block 108 including an input circuit 104 and an adder-subtractor circuit block 105, switches 108, 109, a detecting circuit block 106, and an adjusting and holding circuit block 107 is provided. To compensate for an offset voltage of the input circuit block 102, an offset voltage of the input circuit block 102 is detected at the detecting circuit block 106 by turning on the switches 108, 109, and the detected offset voltage is held in the adjusting and holding circuit block 107, and negative feedback of the held offset voltage to the adder-subtractor circuit block 105 is performed. Thereby, signals Vop, Von having compensated offset voltages are outputted from the input circuit block 102.

9 Claims, 20 Drawing Sheets

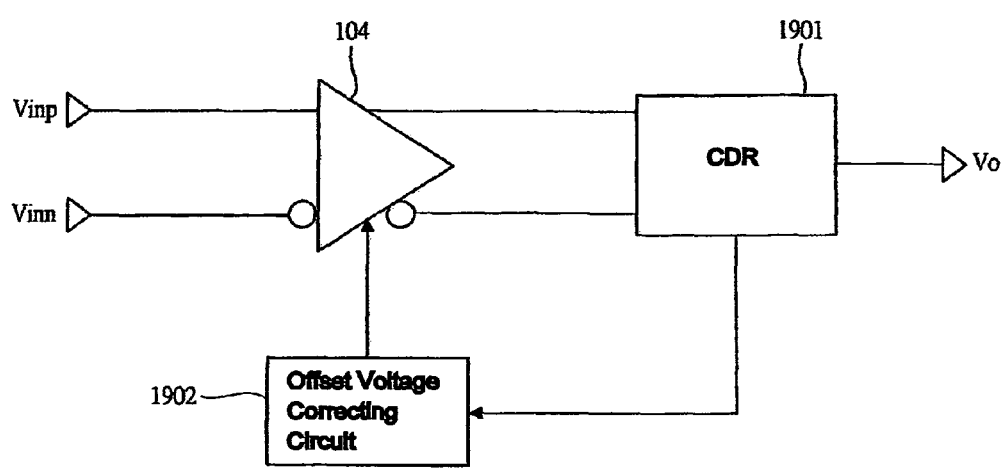

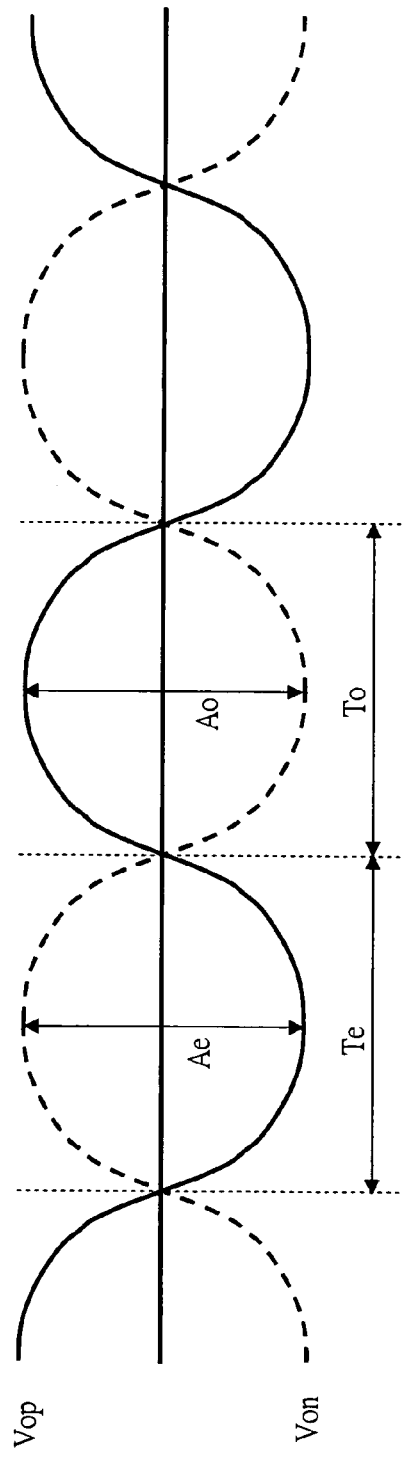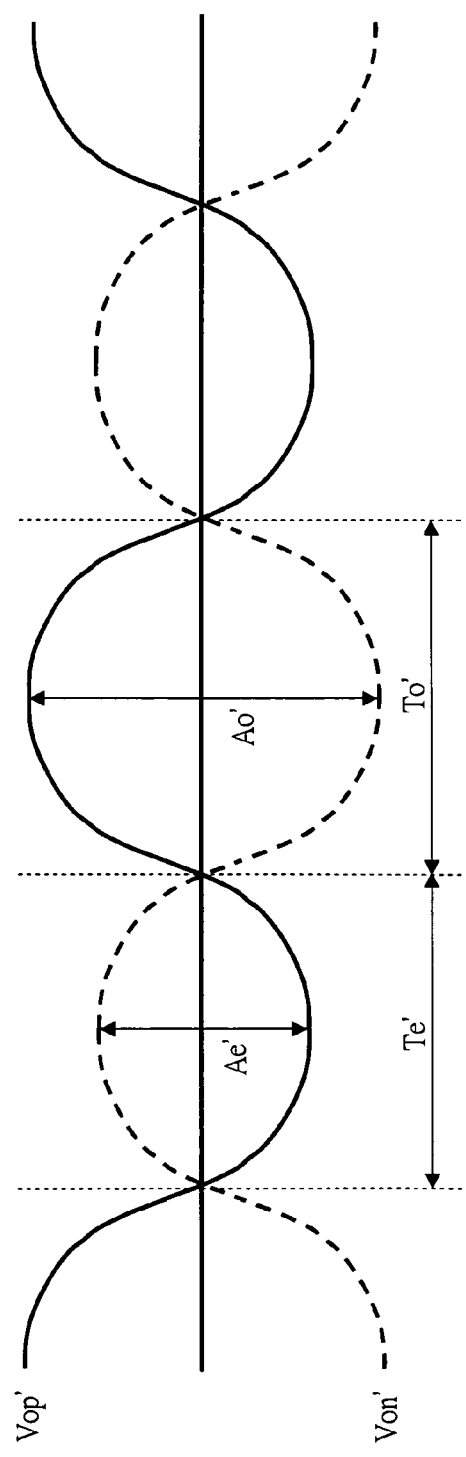

LOW OFFSET INPUT CIRCUIT AND TRANSMISSION SYSTEM WITH THE INPUT CIRCUIT

CROSS-REFERENCE TO RELATED APPLICATION

The present application claims priority from Japanese Patent Application No. JP 2008-142491 filed on May 30, 2008, the content of which is hereby incorporated by reference into this application.

TECHNICAL FIELD OF THE INVENTION

The present invention relates to an input circuit and a transmission system for a high-speed interface of a semiconductor integrated circuit, and in particular, the present invention relates to a circuit technique effective to reduce an offset voltage generated due to variation in device characteristic of an input circuit.

BACKGROUND OF THE INVENTION

FIG. 18A is a diagram illustrating a general configuration of high-speed serial transmission between LSIs in an information device typified by a computer or a network device. The configuration includes an output driver 1501 within a transmitter circuit, a transmission line 101, and an input circuit 104 within a receiver circuit, where the input circuit 104 outputs an output differential signal Vo corresponding to a differential signal Vin so that a logic level is determined according to a difference in an output level between Vop and Von. In the input circuit 104, an error is generated in a level difference between differential signals due to the variation in device characteristic, which can be represented by an equivalent circuit, as illustrated in FIG. 18B. That is, an error voltage Voff shifting a level of an input signal is applied to one of input signals. The error voltage Voff takes a positive or negative value according to a variation amount in circuit characteristic. The error voltage Voff is generally called "offset voltage" 1801. Because of an influence of the offset voltage, a positional relationship between Vop and Von is reversed, an erroneous operation occurs, and transmission quality lowers upon performing a signal transmission. As a general technique of realizing offset voltage reduction of an input circuit, there is a technique such as that described below.

For example, based on Patent Document 1 (U.S. Patent Application Publication No. 2006/0067440), FIG. 19 is a diagram illustrating a configuration example of an input circuit in which an output offset voltage in a signal receiver circuit with respect to a high-speed serial transmission between LSIs is suppressed to a low value. The configuration illustrated in FIG. 19 includes an input circuit 104, a clock and data recovery (CDR) 1901, and an offset voltage correcting circuit 1902. In the configuration, before a normal operation is performed, ten fixed patterns for offset voltage adjustment are transmitted, eye widths between cross points of differential waveforms are observed in the CDR 1901, and the eye widths are adjusted such that eye amplitudes in even number bit and odd number bit become equal to each other. Thereby, an output offset voltage in the input circuit 104 is reduced.

FIG. 20A is a diagram illustrating an output waveform of the input circuit 104 obtained when 10 fixed patterns are transmitted in the case of not having an offset voltage in the input circuit 104. When an offset voltage is not present in the input circuit 104, eye widths Te and To of an even number bit and an odd number bit are equal to each other, and eye amplitudes Ae and Ao of the even number bit and the odd number bit are equal to each other. As illustrated in FIG. 20B, for example, when a positive offset voltage is generated in the input circuit 104, eye widths Te' and To' of the even number bit and the odd number bit are different from each other, and eye amplitudes Ae' and Ao' of the even number bit and the odd number bit are different from each other, resulting in Te'<To' and Ae'<Ao'. The input circuit illustrated in FIG. 19 supplies such a control signal that the eye widths Te' and To' become equal to each other at the clock and data recovery 1901 to the offset voltage correcting circuit 1902, and the offset voltage correcting circuit 1902 adjusts the input circuit 104 according to the control signal so that the eye amplitudes Ae' and Ao' become equal to each other, thereby reducing the offset voltage.

SUMMARY OF THE INVENTION

Now, regarding the technique for reducing an offset voltage of an input circuit such as that described above, the following matters has been revealed.

In the configuration example illustrated in FIG. 19, a canceling amount of an offset voltage is determined from eye widths which are time components. Therefore, a phase interpolator which performs phase calculation of clocks within the clock and data recovery is required to have high performance, and an input offset voltage of, for example, about several mV can be realized, but it is difficult to realize offset reduction to about 1 mV or less. Since it is necessary to always correctly measure eye widths which are time components at an adjustment time of the offset voltage, there is such a problem that the adjustment takes labor and much time is required until the canceling amount is determined.

In the high-speed serial transmission, adjustment of an offset voltage such as that described above is generally performed during a time period called "training period". As a system for performing the adjustment of the offset voltage, various systems such as a system measuring eye widths which are time components (horizontal axis components) such as that described above, a system measuring voltage components of eyes which are vertical axis components, or a system measuring bit error rates are considered. However, in such a system measuring offset voltages indirectly, since it is not easy to realize high precision of measurement accuracy and the offset voltage is adjusted based upon indirect elements, such a case occurs that it is not converged to a desired adjusted state, which essentially results in increase of adjustment time. Such a problem becomes more significant according to progress of high speed transmission rate.

In view of these circumstances, an object of the present invention is to provide a low offset input circuit and a transmission system which can accommodate a high-speed interface and can achieve reduction of an offset voltage. Another object of the present invention is to provide a low offset input circuit and a signal transmission system which can accommodate a high-speed interface and can adjust an offset voltage in a short time. Note that, the above and other objects and novel characteristics of the present invention will be apparent from the description of the present specification and the accompanying drawings.

The typical ones of the inventions disclosed in the present application will be briefly described as follows.

A low offset input circuit according to a typical embodiment of the present invention is mounted on a receiver circuit of a high-speed transmission system including a transmitter circuit, a receiver circuit, and a transmission line, has two operation modes of an input circuit offset voltage detecting operation and an input circuit normal operation, and includes an input circuit block and an offset voltage compensating circuit block. In the input circuit offset voltage detecting operation, as means for directly detecting an offset voltage of the input circuit, variation compensation of the input circuit block is performed by performing short-circuiting between differential input nodes of the input circuit, directly detecting and holding an offset voltage of the input circuit in the offset voltage compensating circuit block, and performing negative feedback of the held offset voltage to the input circuit block. Thereafter, the operation mode transits to the input circuit normal operation, and the input circuit block performs signal amplification in the state where a variation compensation has been performed. Thus, for example, in a high-speed transmission system of Giga (bps) level or higher, signal amplification with a low offset voltage can be achieved with an adjustment performed in a short time by directly detecting an offset voltage and cancelling the offset voltage according to the directly detected offset voltage.

Here, the input circuit block includes, more specifically, an input circuit which can operate at a high speed and an adder-subtractor circuit block which subtracts an output signal from the offset voltage compensating circuit block from an output node of the input circuit. Specifically, the offset voltage compensating circuit block includes a detecting circuit block which detects an offset voltage of the input circuit and an adjusting and holding circuit block which holds the detected offset voltage. In the detecting circuit block, after an offset voltage of the input circuit to be detected is amplified, for example, by a low offset voltage amplifier called "Auto-Zero amplifier" or the like, a digital determination (binary determination or polarity determination) is performed by a comparator. In this manner, by performing a digital determination after once amplifying the offset voltage of the input circuit in the low offset voltage amplifier in this manner, a highly precise detection of the offset voltage can be made possible with a simple configuration. Also, by holding the detected offset voltage in the adjusting and holding circuit block in the next stage as a digital value, signal amplification of the low offset voltage can be continuously performed for a long time by performing a single detecting operation without frequently repeating a detecting operation and a normal operation.

To briefly explain an effect obtained by a representative one of inventions disclosed in the present application, in an input circuit accommodating a high-speed interface, reduction of an offset voltage can be achieved. Also, a time required for reducing the offset voltage can be shortened.

BRIEF DESCRIPTIONS OF THE DRAWINGS

FIG. 19 is a circuit diagram illustrating one example of a configuration for achieving low offset in an input circuit of a conventional art which has been studied prior to the present invention; and FIG. 20A is an explanatory diagram illustrating the case that there is not an offset voltage in the input circuit and FIG. 20B is an explanatory diagram illustrating an adjusting method of an offset voltage when a positive offset voltage is generated in the input circuit in the low offset input circuit illustrated in FIG. 19.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that, the same components are denoted by the same reference symbols throughout the drawings for describing the embodiment, and the repetitive description thereof will be omitted.

First Embodiment

Figure 1:
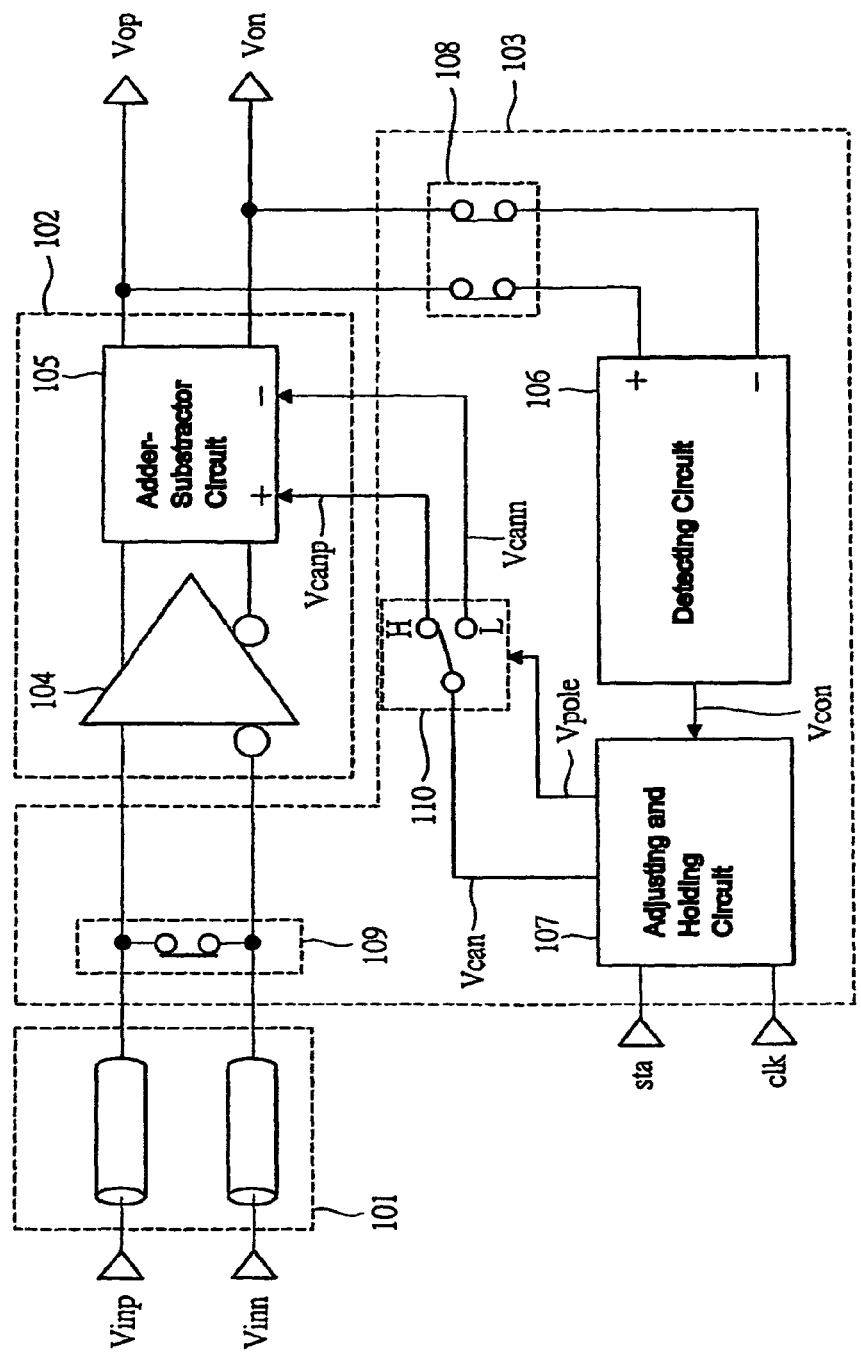
FIG. 1 is a circuit diagram illustrating one example of a configuration of a low offset input circuit according to a first embodiment of the present invention.

A low offset input circuit according to a first embodiment cuts off an input circuit from a transmission line by short-circuiting differential input signal terminals of the input circuit; directly detects and holds an offset voltage of the input circuit; and performs negative feedback of the detected amount to the input circuit, thereby reducing the offset voltage of the input circuit. FIG. 1 is a circuit diagram illustrating one example of a configuration of the low offset input circuit according to the first embodiment of the present invention. The low offset input circuit of FIG. 1 has two operation modes of an input circuit offset voltage detecting operation and an input circuit normal operation, and includes an input circuit block 102 which receives a signal from a transmission line 101, and an offset voltage compensating circuit block 103 which reduces an offset voltage of the input circuit block. The input circuit block 102 includes an input circuit 104 which can perform high-speed operation, and an adder-subtractor circuit block 105 which performs addition or subtraction of the offset voltage of the input circuit 104 using an output from the offset voltage compensating circuit block 103. The offset voltage compensating circuit block 103 includes a detecting circuit block 106 which detects the offset voltage of the input circuit 104, an adjusting and holding circuit block 107 which holds the detected offset voltage, and switches 108 to 110.

In the input circuit offset voltage detecting operation, the detecting circuit block 106 detects an output offset voltage of the input circuit 104 by operating the switches 108 and 109 to be ON. The detected offset voltage is held in the adjusting and holding circuit block 107 of the next stage, and the offset voltage of the input circuit is reduced in the adder-subtractor circuit block 105 by subtracting the held offset voltage from an output of the input circuit 104. The offset voltage can take either of positive value or negative value depending on variation in device characteristic, but it can be handled by determining the polarity of the offset voltage in the detecting circuit block 106 or the adjusting and holding circuit block 107 and performing control such that the switch 110 is turned to 'L' when the offset voltage is positive and the switch 110 is turned to 'H' when the offset voltage is negative from the detecting circuit block or the adjusting and holding circuit block based upon the determination result.

In the input circuit normal operation, the switch 109 is operated to be OFF, a signal from the transmission line 101 is received by the input circuit block 102, the switch 108 is operated to be OFF, and the detecting circuit block 106 is cut off from the input circuit block. Thereby, the input circuit block 102 can accommodate high-speed operation of, for example, several G to several tens G [bps] without being influenced by a load of the detecting circuit block 106. Since the offset voltage detected at the input circuit offset voltage detecting operation time is held in the adjusting and holding circuit block 107, the input circuit 104 can amplify at a low offset voltage in the input circuit normal operation time. Incidentally, FIG. 1 illustrated with the differential type as a whole, but it is clear that the offset voltage can be similarly reduced even with the single-ended type. It is also clear that a similar offset voltage can be detected by grounding a differential input signal terminal except for short-circuiting the differential input signal terminals in order to directly detect the offset voltage of the input circuit.

Second Embodiment

Figure 2:
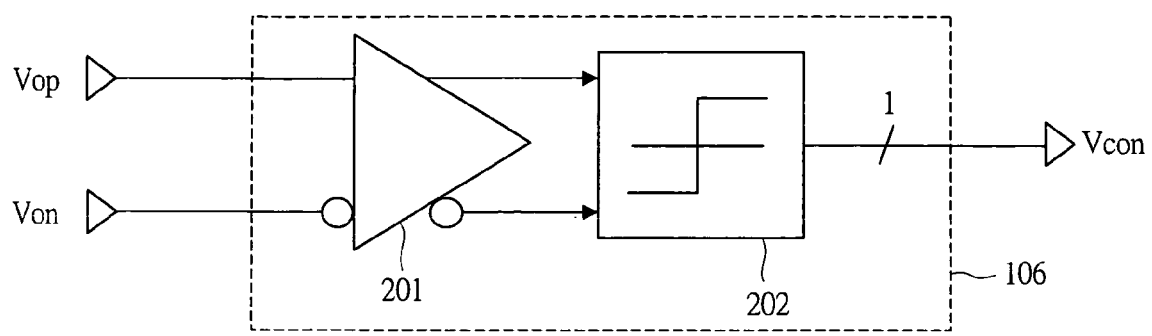
FIG. 2 is a circuit diagram illustrating one example of a configuration of a detecting circuit block of FIG. 1 in a low offset input circuit according to a second embodiment of the present invention.

FIG. 2 is a circuit diagram illustrating one example of a configuration of the detecting circuit block 106 illustrated in FIG. 1 in a low offset input circuit according to a second embodiment of the present invention. The detecting circuit block 106 illustrated in FIG. 2 includes a differential amplifier 201 for a low offset voltage, and a comparator 202. In the present embodiment, variation compensation of the detecting circuit block 106 itself is performed by amplifying an output offset voltage of the input circuit 104 of FIG. 1 in the differential amplifier 201 of a low offset voltage, so that high-precision detection of the offset voltage is made possible. That is, when there is a variation (offset) in the detecting circuit block 106 itself, it is difficult to reduce an output offset voltage of the input circuit 104 with high precision, but such a problem can be solved by using an amplifier having a low offset voltage specification to the differential amplifier 201 in this manner.

Determination about whether the offset voltage amplified by the differential amplifier 201 is positive or negative is performed in the comparator 202, thereby an analog signal is converted to a digital signal. By using the comparator for digitizing, detection at a high amplification can be made possible regardless of a dynamic range of a comparator input, and further high-precision detection of an output offset voltage can be achieved by increasing the gain of the differential amplifier 201 of a low offset voltage. Here, since an output offset voltage to be detected is a direct current component, the differential amplifier 201 of a low offset voltage does not require a high-speed operation, being different from the input circuit 104. Accordingly, both of a high-speed operation and a low offset voltage can be realized as a whole by using an optimal design for a high-speed operation to the input circuit 104 and using an optimal design for high gain to the differential amplifier 201 of a low offset voltage.

Third Embodiment

Figure 3:
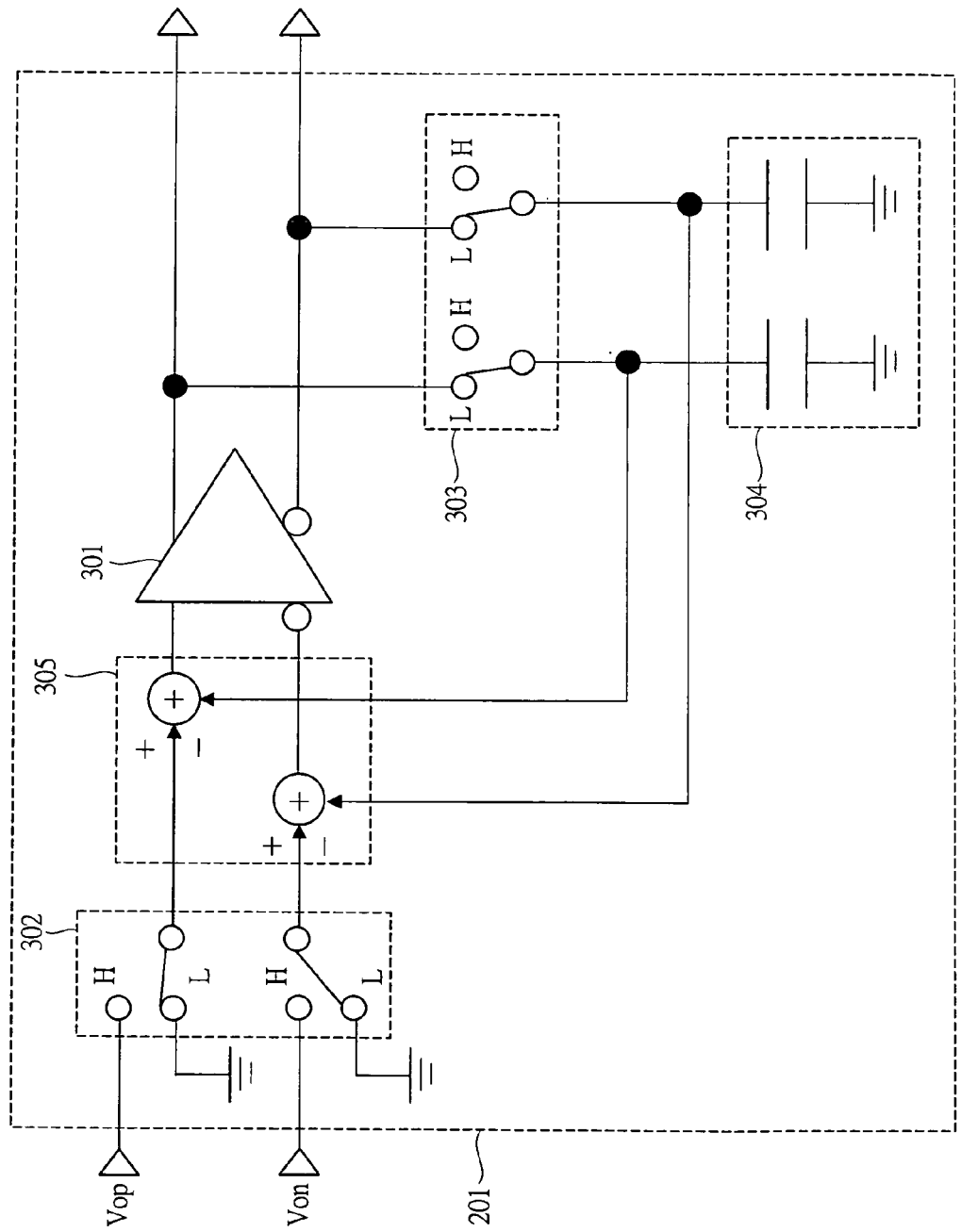
FIG. 3 is a circuit diagram illustrating a detailed configuration example of an amplifier of FIG. 2 in a low offset input circuit according to a third embodiment of the present invention.

FIG. 3 is a circuit diagram illustrating a detailed configuration example of the differential amplifier 201 of FIG. 2 in a low offset input circuit according to a third embodiment of the present invention. The differential amplifier 201 illustrated in FIG. 2 is one called "Auto-Zero amplifier" or the like, for example. The Auto-Zero amplifier is a low offset input circuit utilizing sampling, has two operation modes of an auto-zeroing operation and a normal amplifying operation, and includes a high-gain amplifier 301, a sampling capacitor 304, an adder 305, and switches 302 and 303 for selecting one from the abovementioned two operation modes. In the auto-zeroing operation mode, respective switches in FIG. 3 are closed to "L" sides so that an offset voltage of the amplifier 301 is accumulated in the sampling capacitor 304. In the normal amplifying operation, the respective switches are closed to "H" sides, and an input offset voltage accumulated in the sampling capacitor 304 is subtracted from an input signal in the auto-zeroing operation mode, so that amplification at a low offset voltage can be made possible.

When an input signal inputted into the amplifier 301 is represented as Vi, an output from the amplifier 301 is represented as VAZ, a gain of the amplifier 301 is represented as Gaz, an input offset voltage of the amplifier 301 is represented as Voffaz, and an applied voltage to the sampling capacitor is represented as Vh, a compensation voltage held in the capacitor 304 in the auto-zeroing operation mode is $$Vh = \frac{Gaz V_{offaz}}{1 + G_{az}} \approx V_{offaz},$$ [Equation 1]

where, when a value of the gain Gaz is sufficiently large, the input offset voltage of the amplifier 301 is approximately held in the capacitor 304.

Next, the output voltage VAZ of the amplifier 301 in the amplifying operation mode is $$VAZ = Gaz\left(V_i + \frac{V_{offaz}}{1 + G_{az}}\right) \approx Gaz\left(V_i + \frac{V_{offaz}}{Gaz}\right),$$ [Equation 2]

where the input offset voltage is compressed in the Auto-Zero amplifier by the gain of the amplifier 301, so that low offset can be achieved.

Such an Auto-Zero amplifier can achieve low offset, but it is not adequate to a high-speed operation because refreshing etc. of the sampling capacitor 304 is required. As explained in the second embodiment, however, the differential amplifier 201 of FIG. 2 to be provided with the Auto-Zero amplifier does not require a high-speed operation, and it can be designed optimally in view of achievement of a high gain of the amplifier 301 within the Auto-Zero amplifier. Thereby, as a result, offset reduction of the Auto-Zero amplifier (the differential amplifier 201) and high-precision adjustment of an offset voltage to the input circuit 104 can be made possible.

Fourth Embodiment

Figure 4:
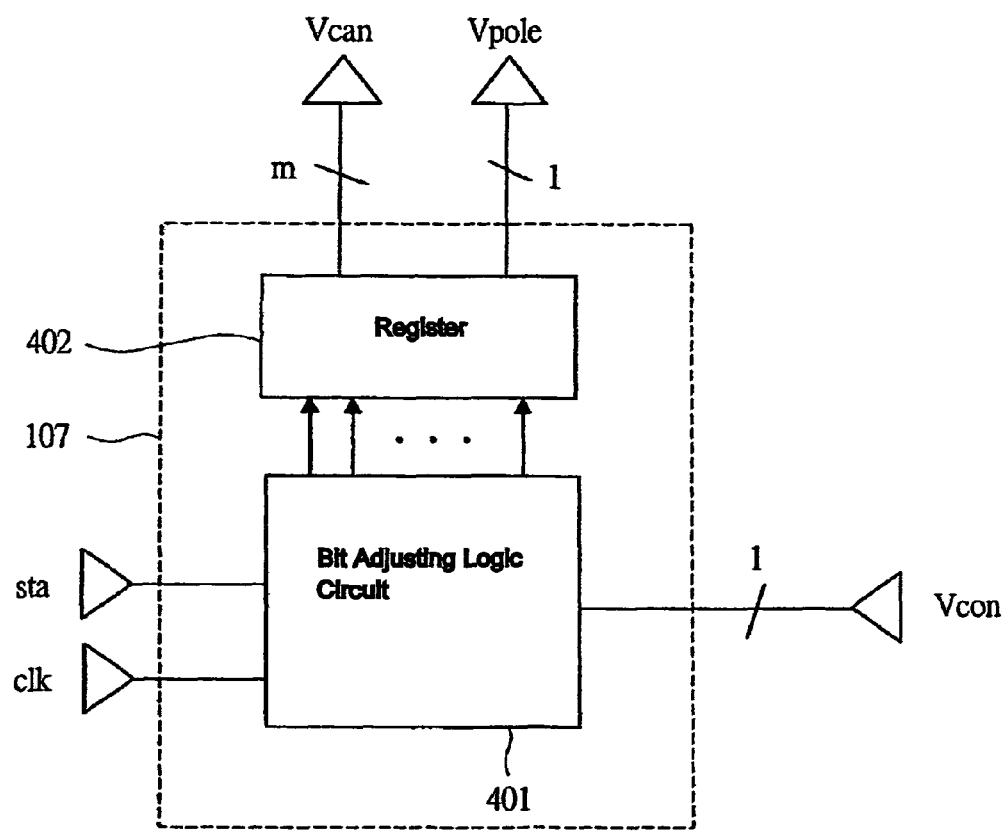
FIG. 4 is a circuit diagram illustrating one example of a configuration of an adjusting and holding circuit block of FIG. 1 in a low offset input circuit according to a fourth embodiment of the present invention.

FIG. 4 is a circuit diagram illustrating one example of a configuration of the adjusting and holding circuit block 107 in a low offset input circuit according to a fourth embodiment of the present invention. The adjusting and holding circuit block 107 of FIG. 4 includes a bit adjusting logic circuit 401 and a register 402. The bit adjusting logic circuit 401 receives information (a digital signal Vcon) about positive or negative of the offset voltage detected in the detecting circuit block 106 of FIG. 1 to perform an adding or subtracting process or encoding of the offset voltage to be reflected in the adder-subtractor circuit block 105, and the register 402 holds a value of the offset voltage in the form of a digital value as bit information. Here, a configuration example holding a digital signal Vcan indicating the magnitude of the offset voltage and holding a digital signal Vpole indicating the sign of the offset voltage is exemplified. By holding the offset voltage as a digital value in this manner, it is not necessary to frequently performing the offset voltage detecting operation, and the normal operation in a state that variation compensation of the input circuit 104 has been performed can be performed for a long time by performing only a single detecting operation.

Fifth Embodiment

Figure 5:
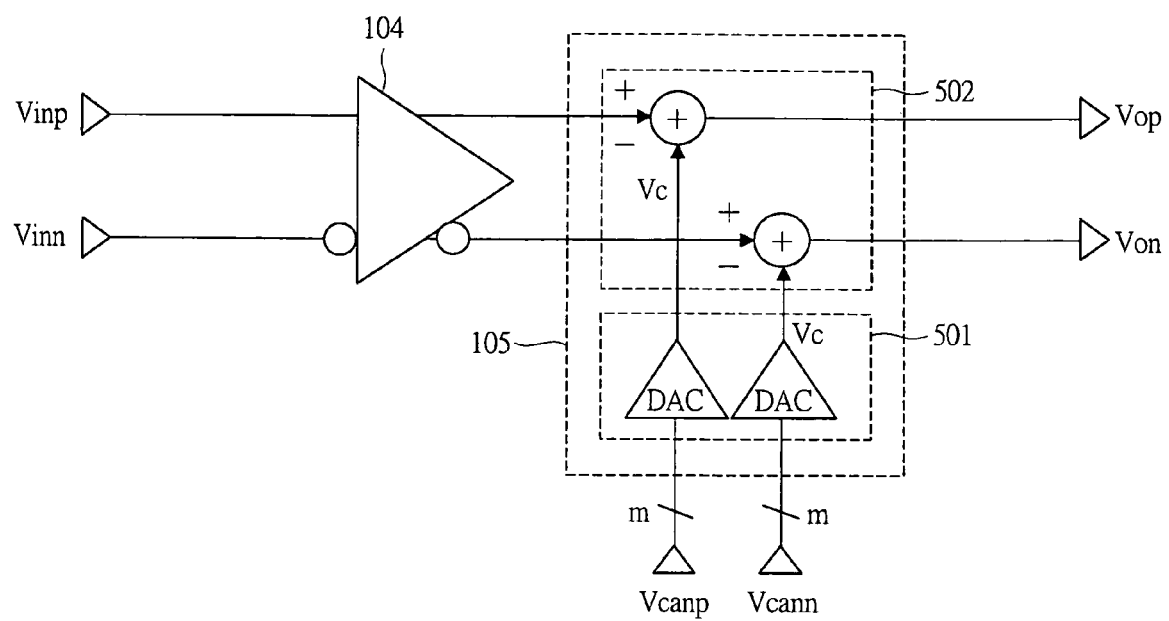
FIG. 5 is a circuit diagram illustrating one example of a configuration of an adder-subtractor circuit block of FIG. 1 in a low offset input circuit according to a fifth embodiment of the present invention.

FIG. 5 is a circuit diagram illustrating one example of a configuration of the adder-subtractor circuit block 105 of FIG. 1 in a low offset input circuit according to a fifth embodiment of the present invention. The adder-subtractor circuit block 105 of FIG. 5 includes a digital-analog converter 501 and an adder 502. As illustrated in FIG. 1 and FIG. 4, according to bit information of the register in the adjusting and holding circuit block 107, a digital signal Vcanp is inputted into the adder-subtractor circuit block 105 when the offset voltage is positive (Vpole is "H"), while a digital signal Vcann is inputted thereinto when the offset voltage is negative (Vpole is "L").

The digital-analog converter 501 of FIG. 5 determines the value of the adjusting voltage Vc by converting the digital signal Vcann or Vcanp to an analog signal. Incidentally, in this case, for example, when an adjusting voltage Vc corresponding to a positive offset voltage (Vcanp) is produced, an adjusting voltage Vc corresponding to a negative offset voltage (Vcann) is made zero, while the adjusting voltage Vc corresponding to the positive offset voltage Vcanp can be made zero in the opposite case. The offset voltage of the input circuit is reduced by performing subtraction of such an adjusting voltage Vc at the adder 502 at an output terminal of the input circuit 104.

Incidentally, subtraction of the adjusting voltage Vc can be performed at an input terminal of the input circuit 104 instead of the output terminal of the input circuit 104 so that a similar effect can be obtained. However, since the offset voltage is amplified and outputted at the output terminal of the input circuit 104 as compared with the input terminal, comparatively-high-precision adjustment of the offset voltage can be achieved by performing subtraction at the output terminal rather than performing subtraction at the input terminal, when a resolution of the digital-analog converter 501 is set constant. From this point of view, it is preferable that the adder-subtractor circuit block 105 is provided on the side of the output terminal of the input circuit 104.

Figure 6:
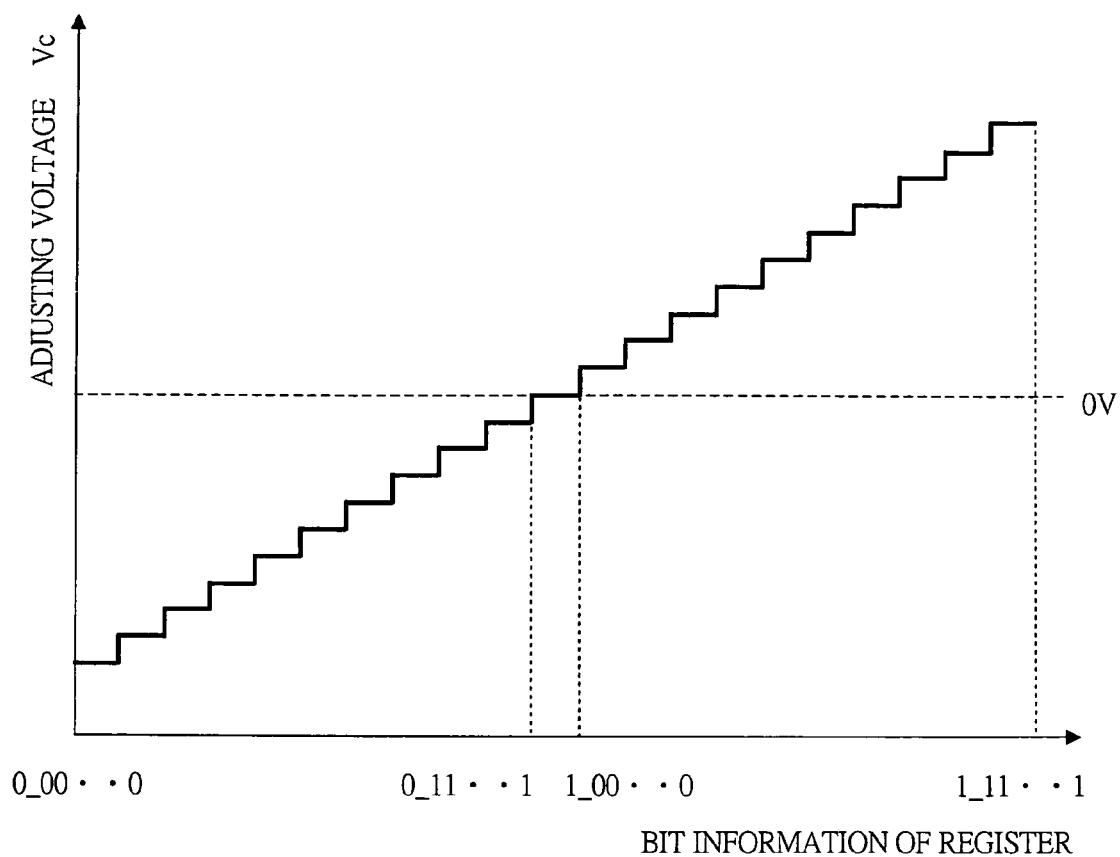
FIG. 6 is an explanatory diagram illustrating an example of a transition of an adjusting voltage in a digital-analog converter of FIG. 5.

FIG. 6 is an explanatory diagram illustrating one example of a transition of the adjusting voltage Vc in the digital-analog converter 501 of FIG. 5. In FIG. 6, for example, the most significant bit of the register 402 of FIG. 4 is Vpole, a plurality of less significant bits thereof is Vcan, the adjusting voltage Vc is zero in the case of "0_11●●1" and "1_00●●0", the adjusting voltage Vc is negative in the range from "0_00●●0" to "0_11●●1", and the adjusting voltage Vc is positive in the range from "1_00●●0" to "1_11●●1". When the adjusting voltage Vc is negative, the absolute value thereof becomes large as approaching "0_00●●0", but when the adjusting voltage Vc is positive, the absolute value thereof becomes large as approaching "1_11●●1". Incidentally, a positive adjusting voltage or a negative adjusting voltage can be actually achieved depending on whether subtraction is performed from one of the differential signals or the other thereof, for example, as illustrated in FIG. 5.

Sixth Embodiment

Figure 7:
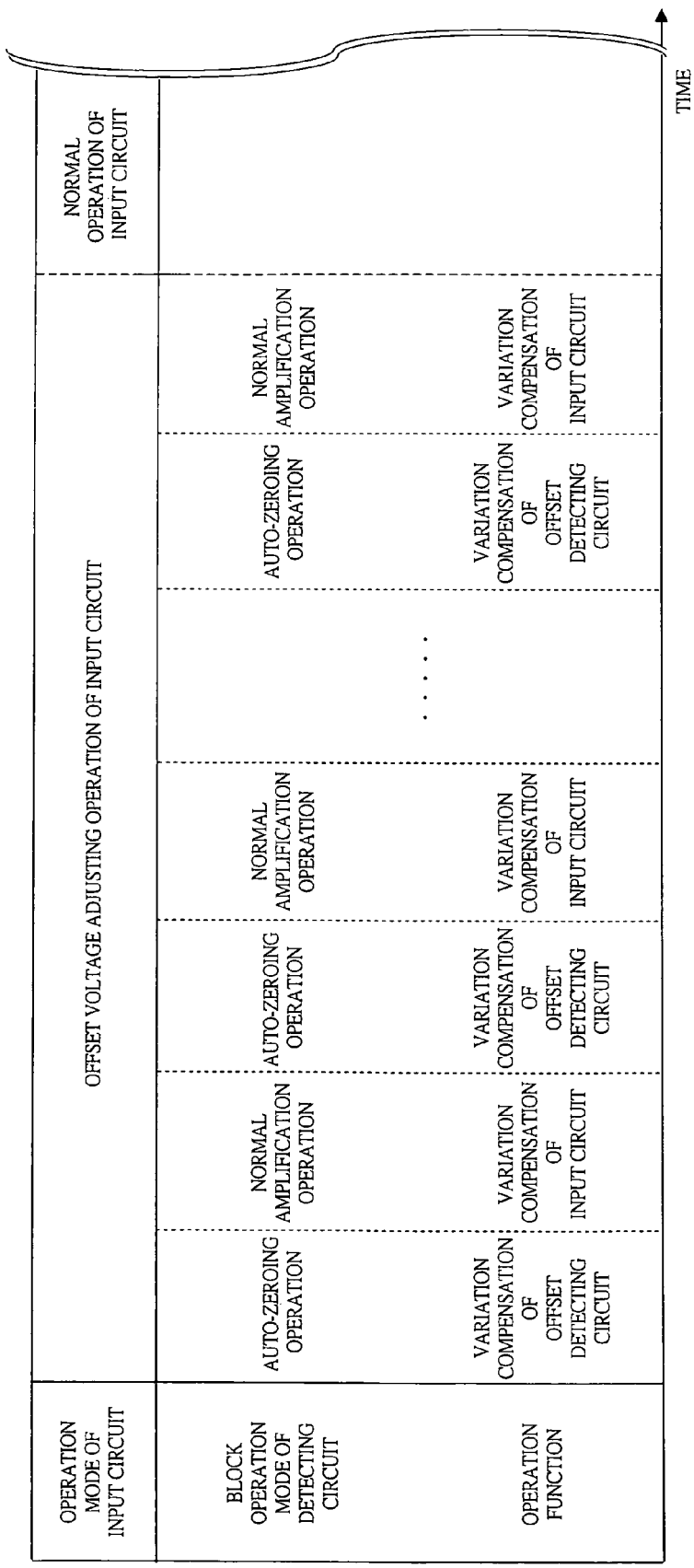
FIG. 7 is a diagram illustrating a transition of an operation state of a low offset input circuit according to a sixth embodiment of the present invention.

FIG. 7 is a diagram illustrating a transition of an operation state of a low offset input circuit according to a sixth embodiment of the present invention. The low offset input circuit according to the present embodiment is provided with two operation modes of an input circuit offset voltage adjusting operation and an input circuit normal operation. Here, the case that an Auto-Zero amplifier such as that in FIG. 3 is used for the differential amplifier 201 within the detecting circuit block 106 illustrated in FIG. 1 is exemplified. The input circuit offset voltage adjusting operation illustrated in FIG. 7 is performed in the state that the switches 108 and 109 of FIG. 1 have been closed, and the auto-zeroing operation and the normal operation of the detecting circuit block 106 are repeatedly performed within the period of the input circuit offset voltage adjusting operation.

That is, the differential amplifier 201 illustrated in FIG. 2 is first caused to perform the auto-zeroing operation to reduce the offset voltage of the differential amplifier 201 so that variation compensation of the detecting circuit block 106 is performed. Subsequently, the differential amplifier 201 is caused to perform a normal amplifying operation so that the offset voltage of the input circuit 104 is detected with high precision by the detecting circuit block 106. Then, upon receiving the detection result, the offset voltage to be set to the adder-subtractor circuit block 105 is changed and the auto-zeroing operation and the normal amplifying operation of the differential amplifier 201 are similarly performed in this state again so that variation compensation of the input circuit 104 is performed by repeating these operations until a predefined result is obtained. Thereafter, the switches 108 and 109 of FIG. 1 are put in an opened state and the normal operation of the input circuit 104 is performed in the state that the variation compensation of the input circuit 104 has been performed.

Figure 8:
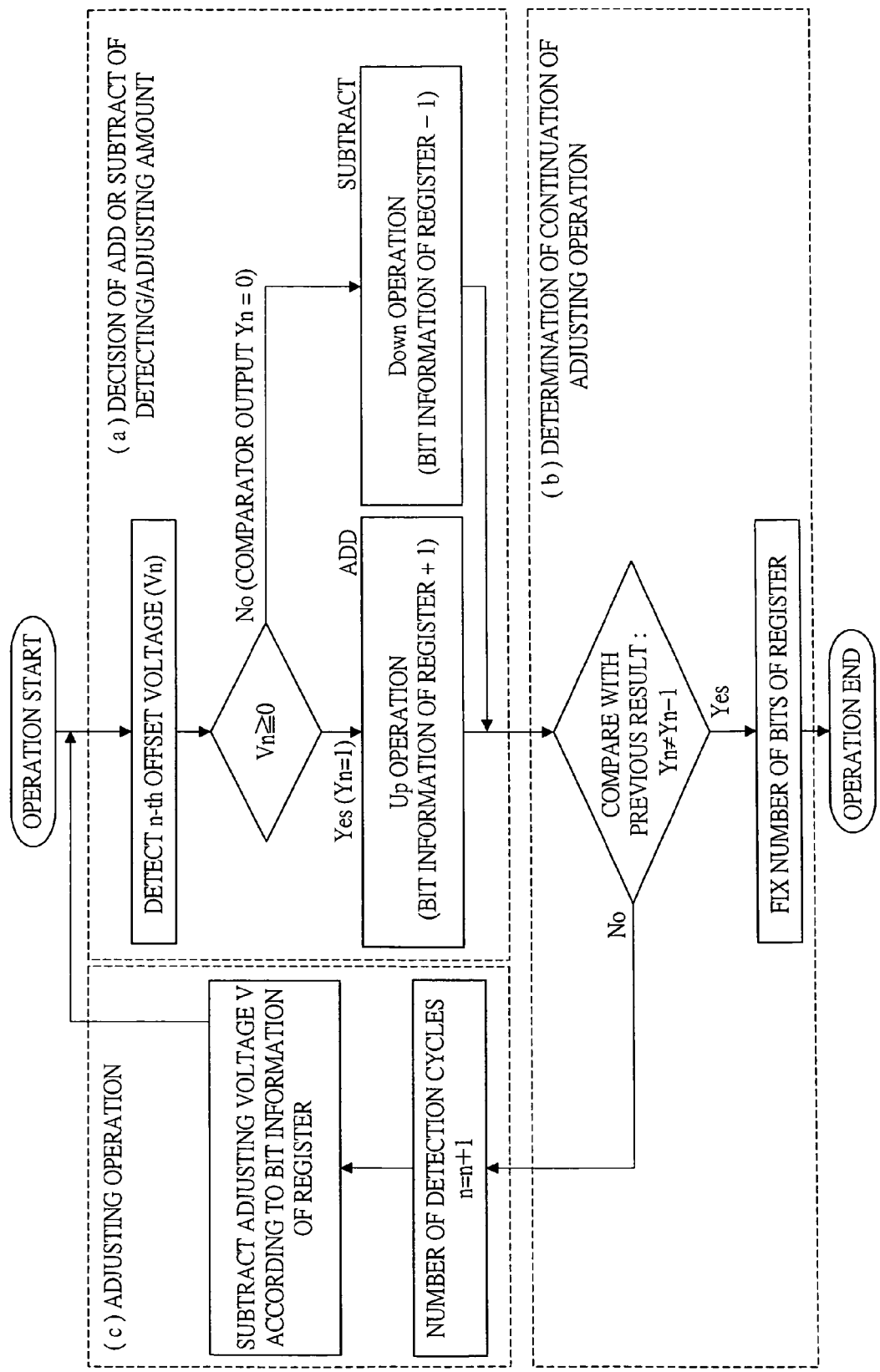
FIG. 8 is a flowchart illustrating one example of operation contents of variation compensation of an input circuit in the low offset input circuit according to the sixth embodiment of the present invention.

FIG. 8 is a flowchart illustrating one example of operation contents of the variation compensation of the input circuit 104. The variation compensation of the input circuit 104 is performed by three operations of: (a) detection and adjustment amount adding/subtracting determination, (b) adjusting operation continuation determination, and (c) adjustment. In the operation (a), after the output offset voltage Vn is amplified in the differential amplifier 201, determination about positive or negative is performed in the comparator 202, so that the detecting circuit block 106 outputs an Up operation signal (Yn=1) when the determination is positive, while the detecting circuit block 106 outputs a Down operation signal (Yn=0) when the determination is negative. According to the determination result, in the bit adjusting logic circuit 401, 1 is added to the bit information of the register 402 if Yn=1, while 1 is subtracted from the bit information of the register 402 if Yn=0, so that addition or subtraction of the offset adjustment amount is determined. In the operation (b), the UP/Down determination signal Yn is compared with the previous determination result Yn−1, and if Yn=Yn−1, the operation transits to the operation (c), where the adjustment operation is continued. If Yn≠Yn−1, the adjustment operation is terminated, and a cancelling amount of the offset voltage is determined by fixing the bit information of the register. Regarding the operation (c), after the number of detection times is updated to (n+1) and subtraction of the adjusting voltage Vc is performed according to the bit information of the register, the operation moves to the operation (a).

Figure 9:
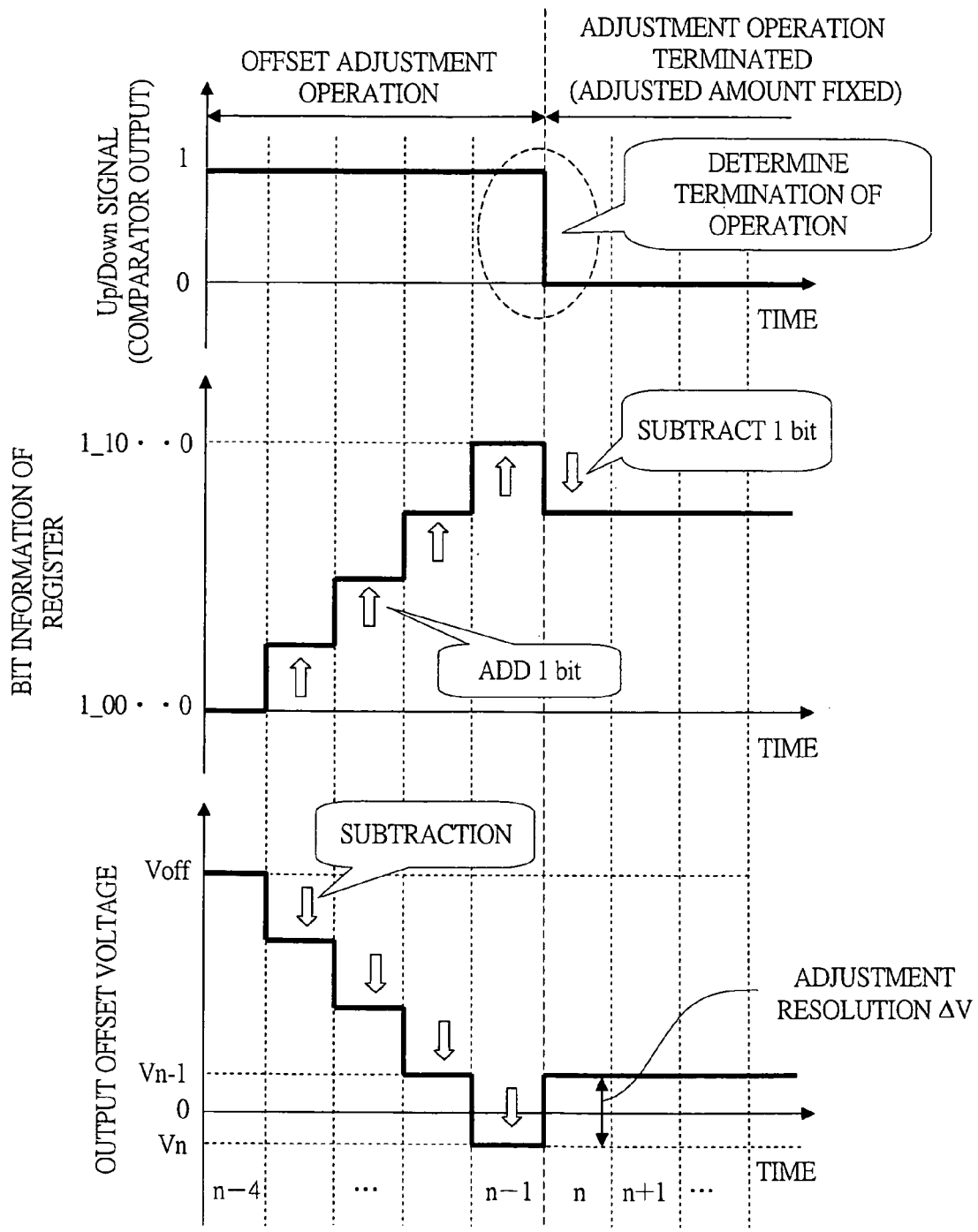
FIG. 9 is a supplemental diagram for explaining a specific example of the operation contents of FIG. 8.

FIG. 9 is an explanatory diagram illustrating one example of an operation state of an output of the comparator 202, bit information of the register 402, and the output offset voltage when a positive output offset voltage Voff has been generated at the input circuit 104. When there is a positive offset voltage, subtraction is performed from the positive output offset voltage Voff in ΔV unit until an output of the comparator 202 is reversed, and when the resulting Vn becomes negative, the output of the comparator is reversed (Yn≠Yn−1) so that the adjustment operation is terminated. As a result, the output offset voltage after adjustment of the input circuit 104 is lowered to a resolution ΔV of the digital-analog converter 501 or less. In the present embodiment, variation compensation of the input circuit 104 can be realized in a short time by providing an offset voltage compensating circuit block with a simple configuration in this manner.

Seventh Embodiment

Figure 14:
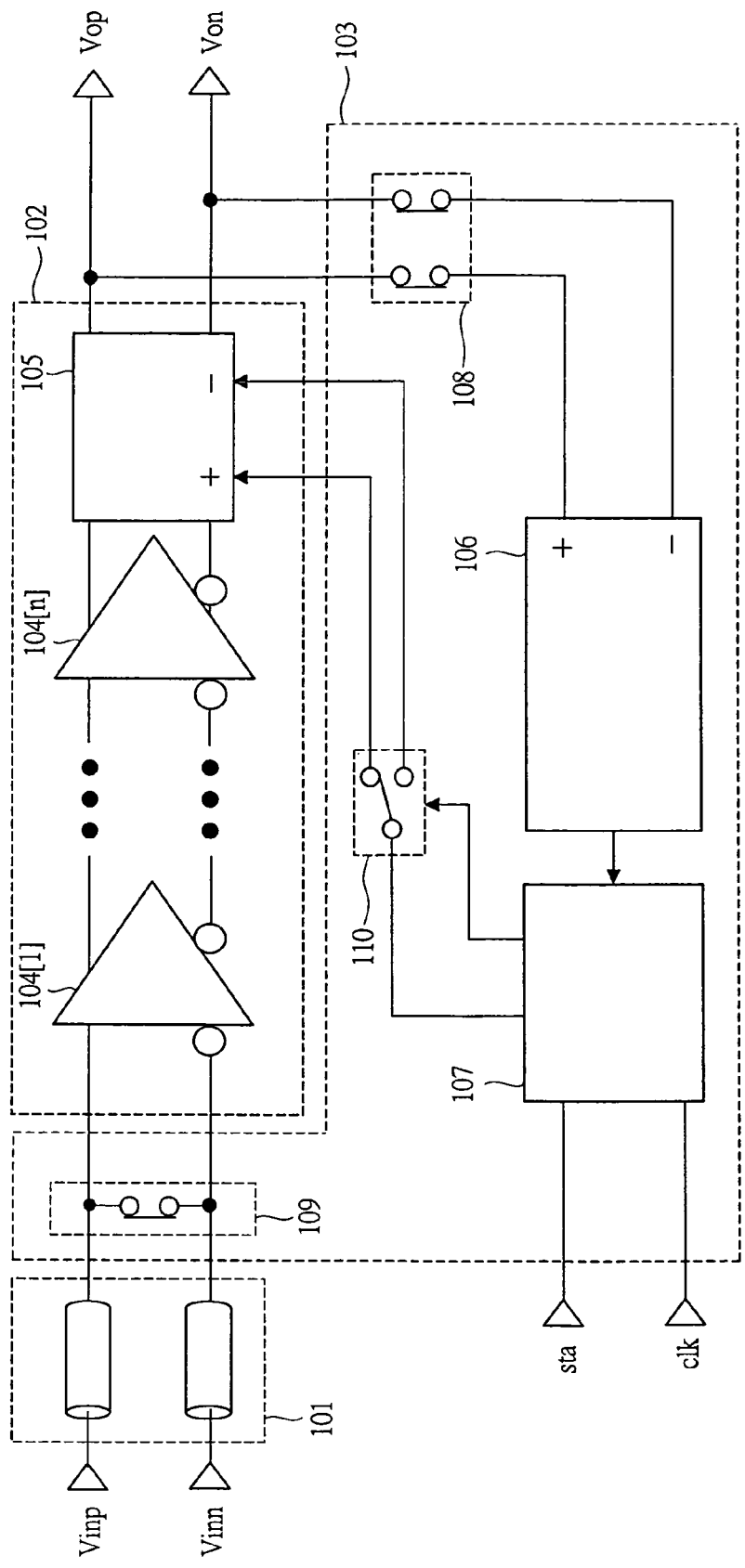
FIG. 14 is a circuit diagram illustrating one example of a configuration of a low offset input circuit according to a seventh embodiment of the present invention.

FIG. 14 is a circuit diagram illustrating an example of a configuration of a low offset input circuit according to a seventh embodiment of the present invention. By configuring the input circuit 104 in FIG. 1 using a plurality of cascaded input circuits 104[1] to 104[n], the low offset input circuit illustrated in FIG. 14 is configured such that variation compensations of the plurality of cascaded input circuits 104[1] to 104[n] are performed in block. Since the other configuration in the low offset input circuit of this embodiment is similar to those of the embodiments described above, detailed explanation thereof is omitted. In the input circuit offset voltage detecting operation, the switches 108 and 109 are turned on, so that output offset voltages of all the input circuits within the input circuit block 102 are collectively detected at the detecting circuit block 106. The detected offset voltages are held in the adjusting and holding circuit block 107 and subtraction of the offset voltage detected using the adder-subtractor circuit block 105 is performed at the output of the input circuit 104[n], so that offset reduction can be achieved.

In the high-speed serial transmission, since loss of the transmission line 101 is large and the receiver circuit must perform signal amplification corresponding to the amount of the loss, such a configuration is ordinarily used that a plurality of input circuits which can operate at a high speed are cascaded in order to obtain a gain. Since the amplitude of an offset voltage desired to be detected is made large by observing an offset voltage at an output terminal of the cascaded input circuits, design of a digital-analog converter is made easy because high-precision offset reduction can be made possible even when the resolution of the digital-analog converter within the adder-subtractor circuit block 105 takes a large value.

Eighth Embodiment

Figure 15:
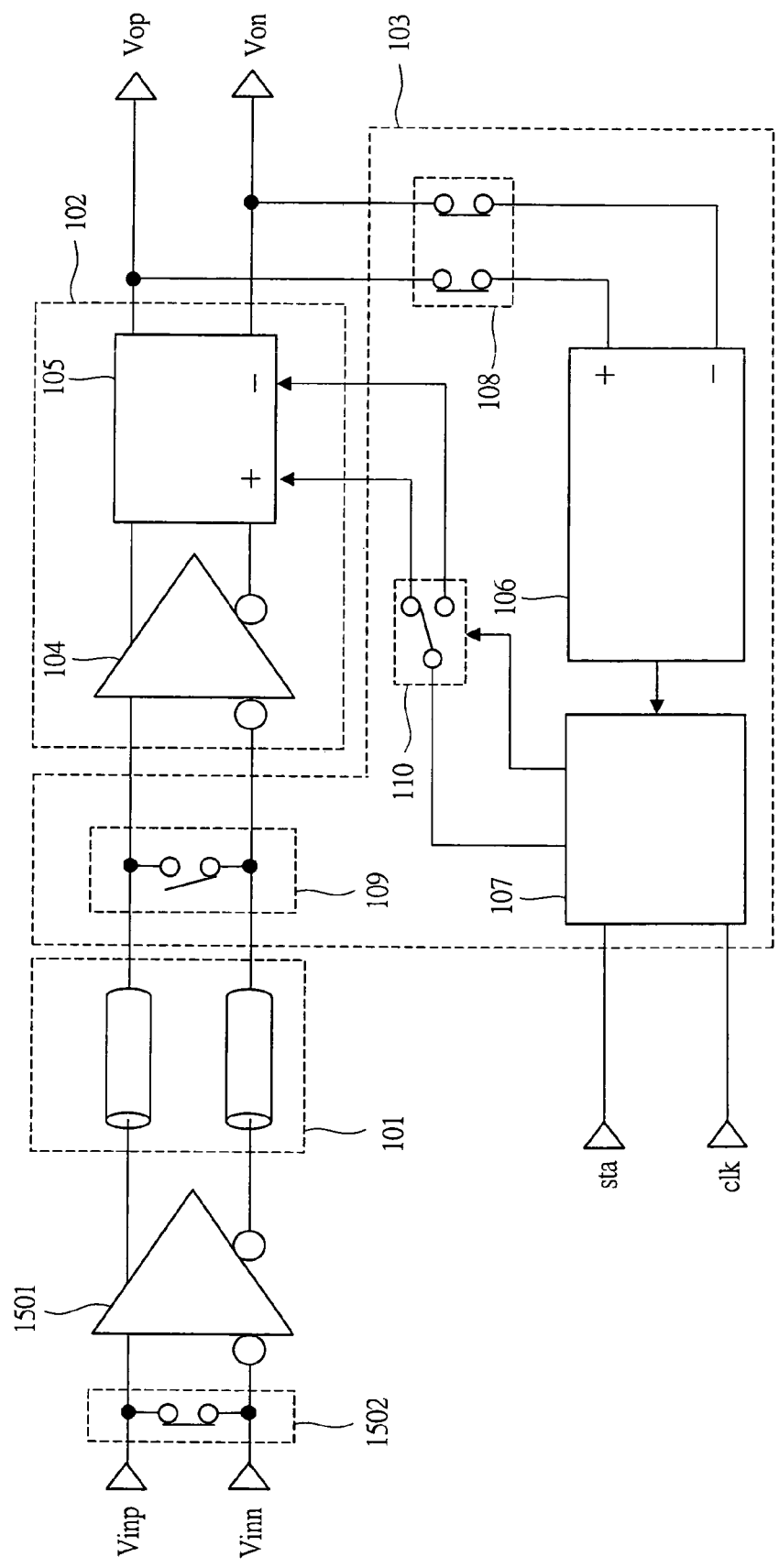
FIG. 15 is a circuit diagram illustrating a configuration example of a whole signal transmission system including a low offset input circuit according to an eighth embodiment of the present invention.

FIG. 15 is a circuit configuration illustrating a configuration example of a whole signal transmission system including a low offset input circuit according to an eighth embodiment of the present invention. A feature of the signal transmission system illustrated in FIG. 15 lies in that the low offset input circuit of FIG. 1 is used as a receiver circuit, an output driver 1501 is provided before the transmission line 101 as a portion of a transmitter circuit, and a switch 1502 for short-circuiting differential input terminals is provided to input terminals of the output driver 1501.

Except for the input circuit 104, offset voltages are also generated respectively at the output driver 1501 due to unbalance of a PN output amplitude due to variation in device characteristic and at the transmission line 101 due to the PN unbalance generated due to a difference in wire length of the transmission line 101. In the configuration example illustrated in FIG. 15, offset voltages generated at the output driver 1501, the transmission line 101, and the input circuit 104 are collectively detected by the detecting circuit block 106 by operating the switch 1502 to be ON, operating the switch 109 to be Off, and operating the switch 108 to be On at a detecting time of the input circuit offset voltage. The detected offset voltage is held in the adjusting and holding circuit block 107, and all variation compensations in such a signal transmission system can be collectively performed by performing subtraction of the detected offset voltage at the output of the input circuit 104, so that offset reduction of the whole signal transmission system can be realized.

Ninth Embodiment

Figure 16:
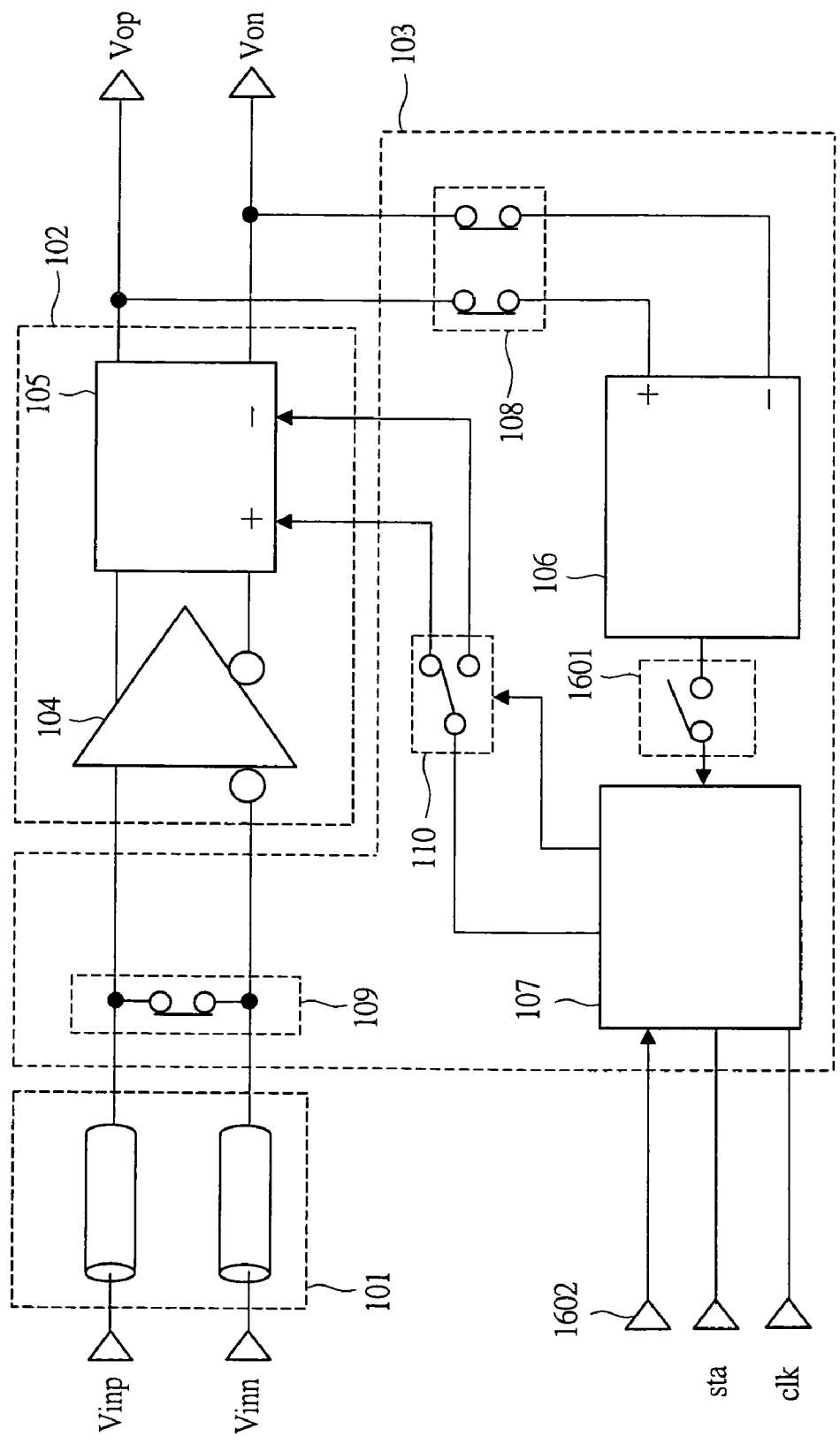
FIG. 16 is a circuit diagram illustrating one example of a configuration of a low offset input circuit according to a ninth embodiment of the present invention.

FIG. 16 is a circuit diagram illustrating one example of a configuration of a low offset input circuit according to a ninth embodiment of the present invention. The low offset input circuit illustrated in FIG. 16 has such a configuration that a switch 1601 for cutting off the detecting circuit block 106 and an external adjusting terminal 1602 for directly changing the bit information of the register within the adjusting and holding circuit block 107 are added as compared with the configuration example of FIG. 1. In the configuration example, detection of the offset voltage is performed by observing output terminals (Vop, Von) of the input circuit block 102 in the state that the switch 109 has been turned on and the switch 1601 has been turned off. Offset reduction of the input circuit 104 can be achieved by directly changing the bit information of the register at the external adjusting terminal 1602 such that the observed offset voltage becomes small. It is clear that adjustment of the bit information of the register performed by the external adjusting terminal 1602 can be realized similarly in the case of the seventh embodiment or the eighth embodiment.

Tenth Embodiment

Figure 17:
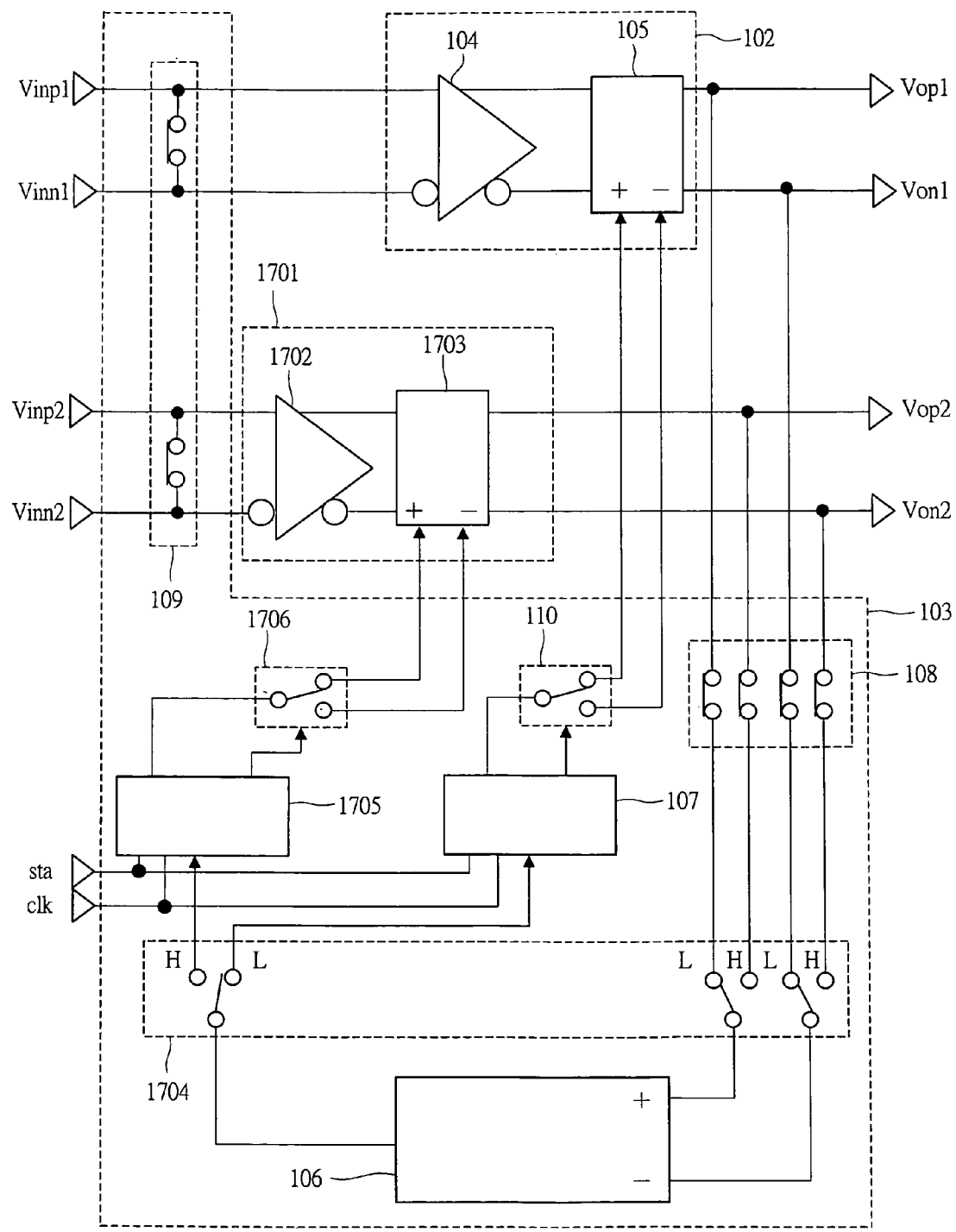
FIG. 17 is a circuit diagram illustrating one example of a configuration of a low offset input circuit according to a tenth embodiment of the present invention.
Figure 18A:
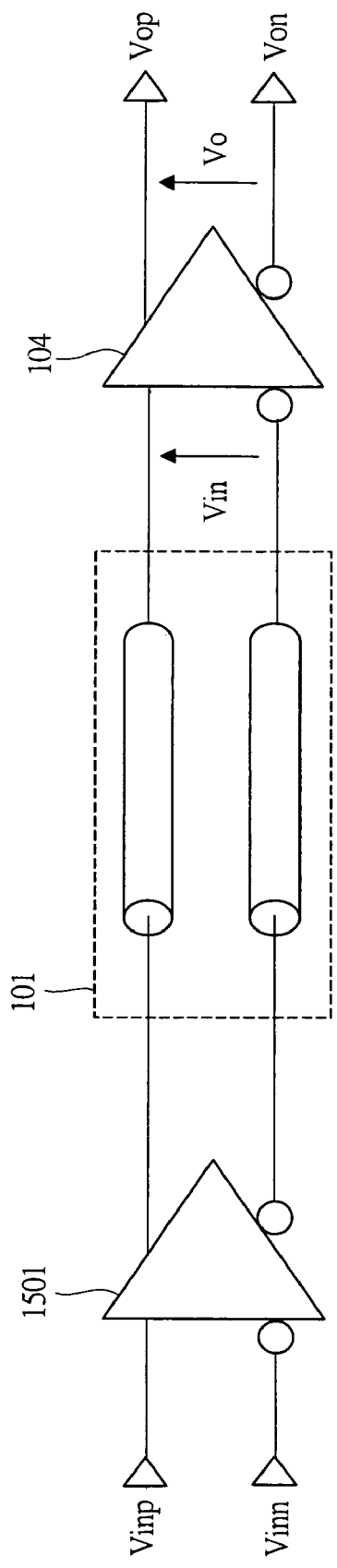
FIG. 18A is a schematic configuration diagrams and FIG. 18B is a diagram of an equivalent circuit of a receiver circuit having variation in device characteristic of transmitter and receiver circuits of a conventional art which has been studied prior to the present invention.
Figure 18B:
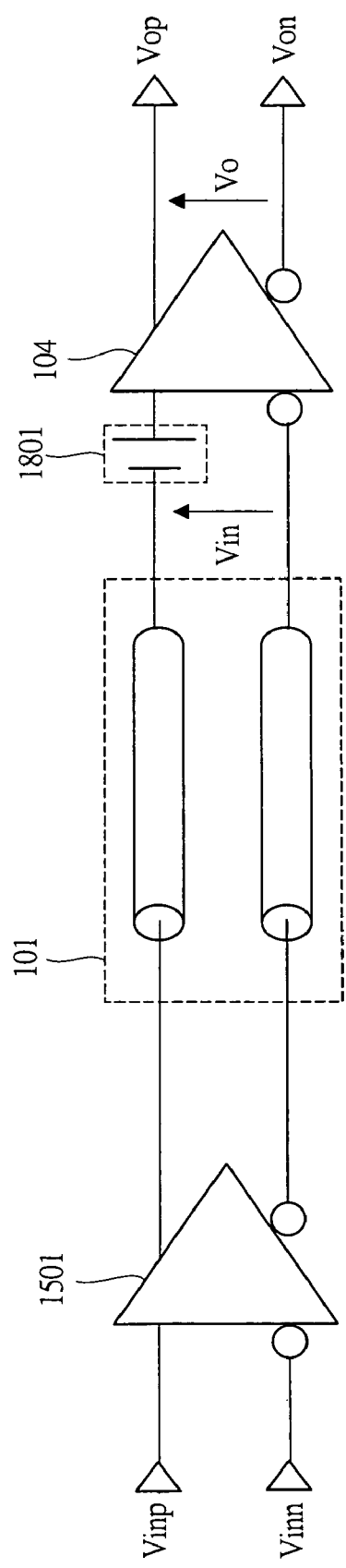

FIG. 17 is a circuit diagram illustrating one example of a configuration of a low offset input circuit according to a tenth embodiment of the present invention. The low offset input circuit illustrated in FIG. 17 is configured such that a set of an input circuit block 102 and an adjusting and holding circuit block 107 and a set of an input circuit block 1701 and an adjusting and holding block 1705 are connected in parallel and offset reduction of two input circuit blocks is achieved by using only one detecting circuit block 106. Regarding detection of offset voltages, the switch 1704 is first closed to the 'L' side so that an offset voltage of the input circuit block 102 is detected at the detecting circuit block 106 and the detection result is held in the adjusting and holding circuit block 107. Next, the switch 1704 is closed to the 'H' side so that an offset voltage of the input circuit block 1701 is detected at the detecting circuit block 106, and the detection result is held in the adjusting and holding circuit block 1705. By using the one detecting circuit block 106 for two sets of input circuit blocks in this manner, variations in the two sets of input circuits are compensated for and the result can be held.

While two sets of an input circuit block and an adjusting and holding circuit block are assumed in FIG. 17, it goes without saying that offset reduction can be similarly achieved in a plurality of sets such as three or more sets by only one detecting circuit block. Since the detecting circuit block is configured by an analog circuit, for example, as illustrated in FIG. 2 and FIG. 3, a circuit area becomes relatively large. Therefore, the area efficiency is increased according to multi-channeling by using such a configuration.

Eleventh Embodiment

Figure 10:
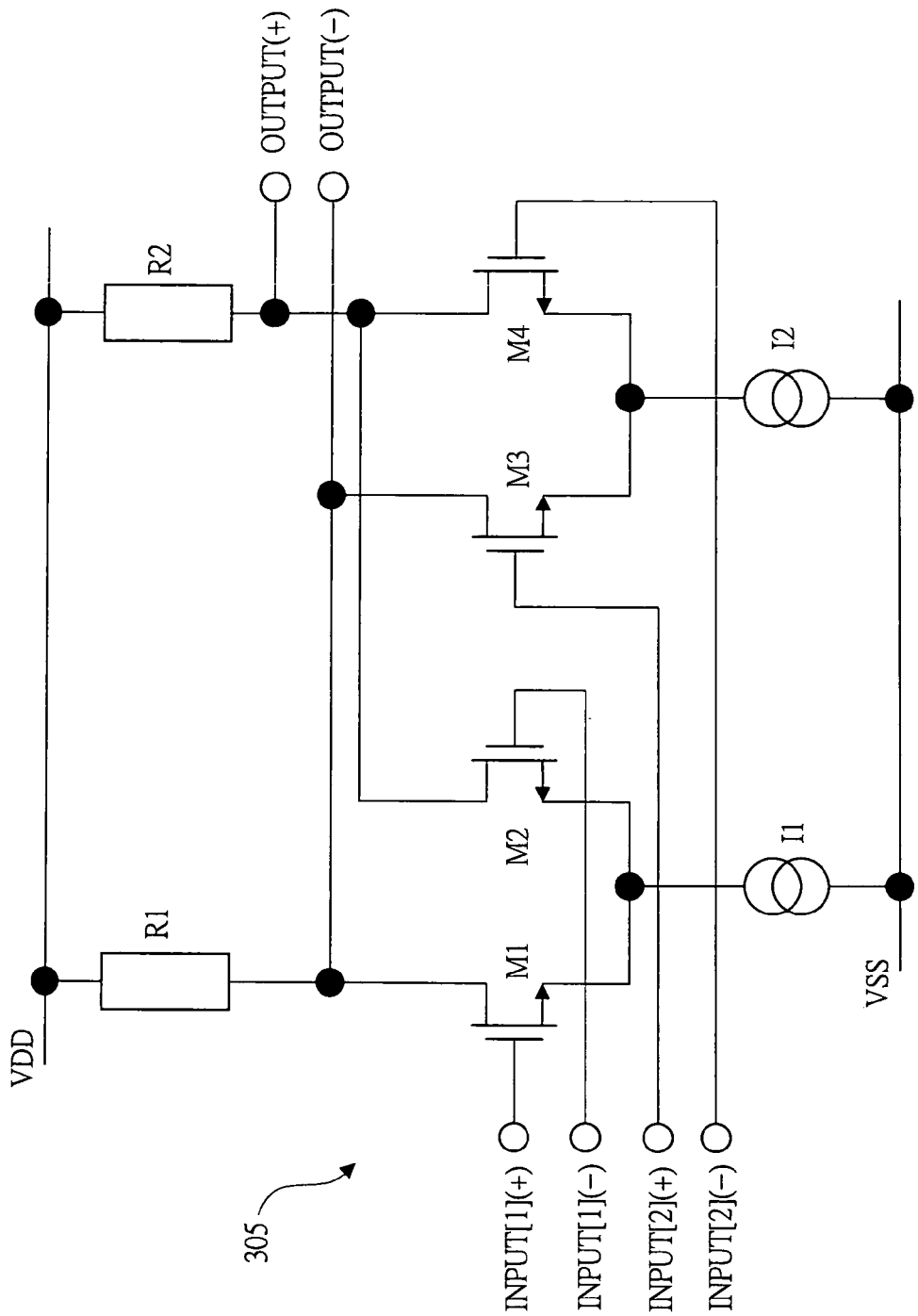
FIG. 10 is a circuit diagram illustrating one example of a specific circuit configuration of an adder in the amplifier of FIG. 3.
Figure 11:
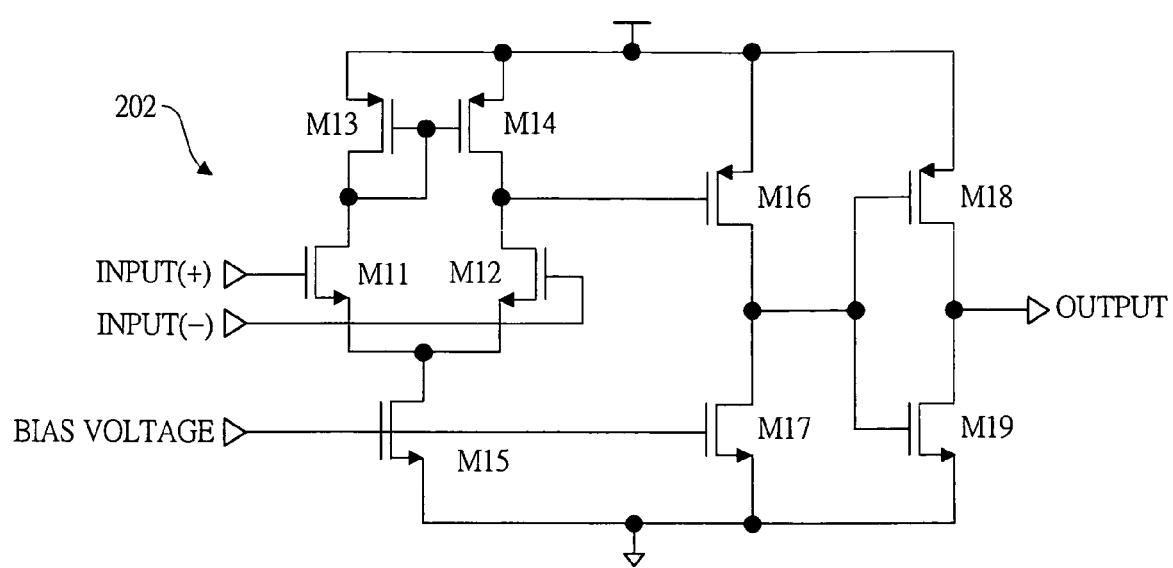
FIG. 11 is a circuit diagram illustrating one example of a specific circuit configuration of a comparator in the detecting circuit block of FIG. 2.
Figure 12A:
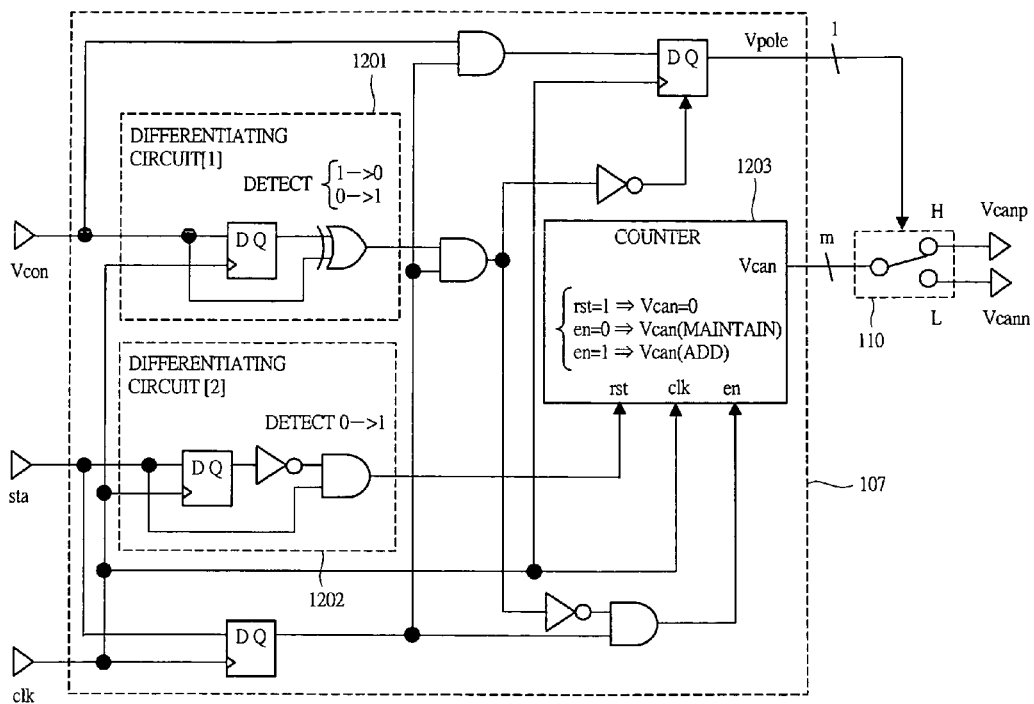
FIGS. 12A and 12B illustrate a detailed example of an adjusting and holding circuit block illustrated in FIG. 1, FIG. 12A being a circuit diagram illustrating one example of a circuit configuration of the adjusting and holding circuit block and FIG. 12B being a timing chart illustrating an operation example of FIG. 12A.
Figure 12B:
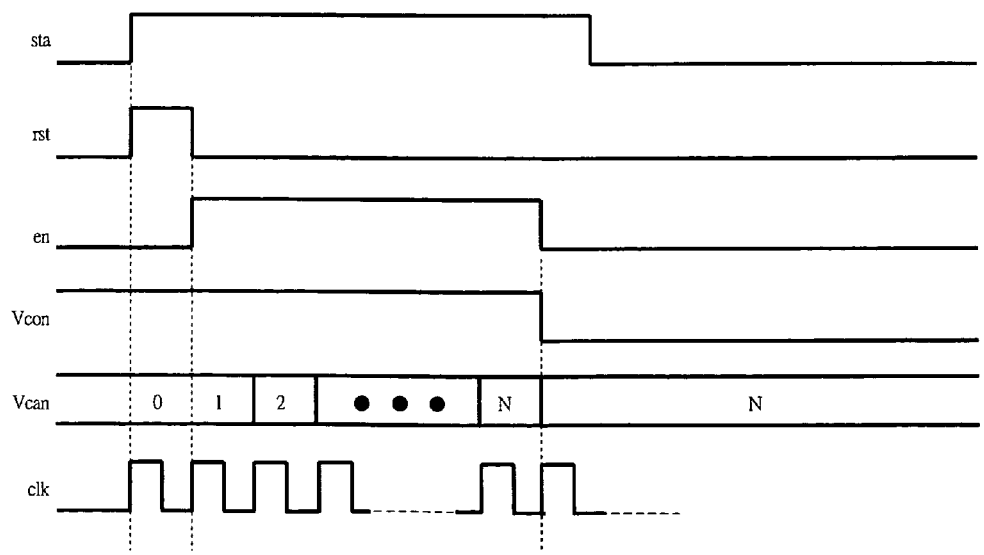
Figure 13:
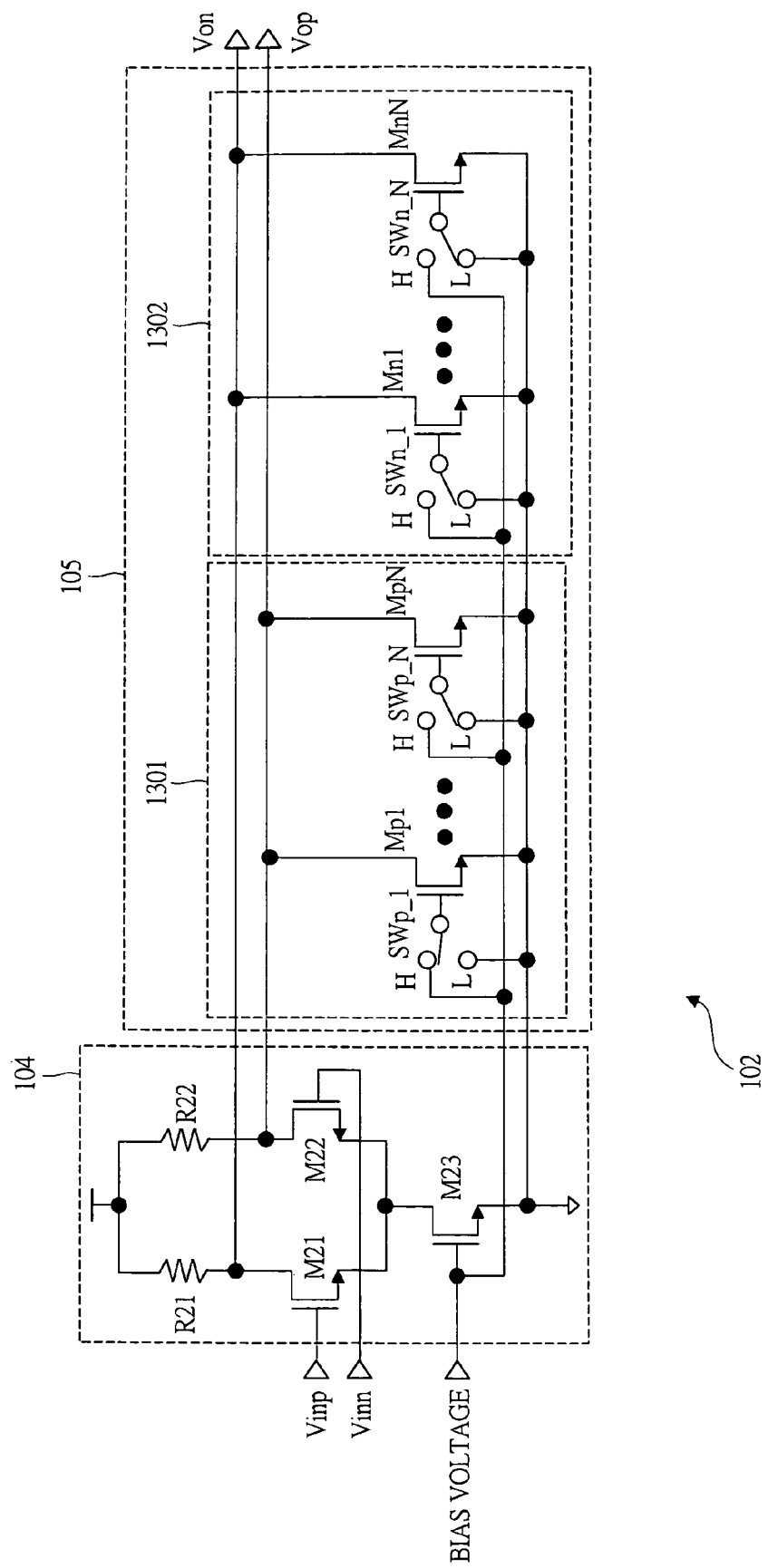
FIG. 13 is a circuit diagram illustrating one example of a detailed circuit configuration of an input circuit block illustrated in FIG. 1.

In an eleventh embodiment of the present invention, detailed configuration examples of circuits in some of the respective low offset input circuits described above will be described. FIG. 10 is a circuit diagram illustrating one example of a detailed circuit configuration of the adder 305 in the differential amplifier 201 of FIG. 3. FIG. 11 is a circuit diagram illustrating one example of a detailed circuit configuration of the comparator 202 in the detecting circuit block 106 of FIG. 2. FIGS. 12A and 12B illustrate one detailed example of the adjusting and holding circuit block 107 in FIG. 1, FIG. 12A being a circuit diagram illustrating one example of a circuit configuration of the adjusting and holding circuit block 107 and FIG. 12B being a timing chart illustrating an operation example of the circuit configuration of FIG. 12A. FIG. 13 is a circuit diagram illustrating one example of a detailed circuit configuration of the input circuit block 102 of FIG. 1.

The adder 305 illustrated in FIG. 10 takes a differential configuration and is configured to perform voltage addition of differential signals inputted from (+) and (−) of input [1] into MOS transistors M1 and M2 configuring a differential pair and differential signals inputted from (+) and (−) of input [2] into MOS transistors M3 and M4 configuring a differential pair via load resistances R1 and R2, and to output the result to outputs (+) and (−). At this time, though an offset voltage is generated due to variations of the MOS transistors M1 and M2, M3 and M4, and the load resistances R1 and R2, the offset voltage is reduced according to the auto-zeroing operation explained in the third embodiment.

The comparator 202 illustrated in FIG. 11 takes a differential configuration and includes a two-stage amplifier of a differential amplifier formed of MOS transistors M11 to M15 and a source grounding circuit formed of MOS transistors M16 and M17. Since the MOS transistor M17 is a constant current source, its drivability of an output is low, therefore the MOS transistor M17 is added with an inverter formed of MOS transistors M18 and M19 at an output stage thereof in order to compensate for the low drivability. Differential signals inputted into the MOS transistors M11 and M12 are amplified in the two-stage amplifier, where 1 is outputted when the input (+) is larger than the input (−), while 0 is outputted when the input (−) is larger than the input (+), so that determination about whether an input signal is positive or negative is made and a signal is converted from an analog value to a digital value. At this time, an offset voltage is generated due to variations in the MOS transistors M11 to M14 and an error occurs about the determination about positive and negative, but influence of the error is small because an input signal is amplified in the differential amplifier 201 of a low offset voltage in advance, as explained in the second embodiment.

The adjusting and holding circuit block 107 of FIG. 12A mainly includes two differentiating circuits (transition detecting circuits) [1] 1201 and [2] 1202 and a counter 1203. The adjusting and holding circuit block 107 is inputted with three signals of an output digital signal Vcon of the comparator 202, a signal sta for starting an operation of the adjusting and holding circuit block 107 at the time of 'H', and a clock signal clk, and outputs a digital signal Vcan indicating the value of the counter 1203 and a digital signal Vpole indicating the polarity of the output digital signal Vcon. The differentiating circuit [1] 1201 outputs a pulse signal upon detecting a signal transition of the output digital signal Vcon, while the differentiating circuit [2] 1202 outputs a pulse signal upon detecting a signal transition of the signal sta from 0 to 1. Upon reception of a reset signal rst, the counter 1203 is reset to zero, and performs a counting operation while an enable signal en is at the 'H' level in synchronization with the clock signal clk.

An operation example in the case that the output (Vcon) of the comparator 202 is 'H' will be described below with reference to the timing chart illustrated in FIG. 12B. First, the counter 1203 is reset by setting sta to 'H' so that the Vcan is made zero. After one cycle thereafter, en of the counter becomes 'H' and en maintains 'H' until a transition of the output digital signal Vcon is detected by the differentiating circuit [1] 1201. The counter 1203 performs a counting operation in synchronization with clk while en is being at 'H' to increase the value of Vcan. When Vcon changes from 'H' to 'L', en of the counter also changes to 'L', and the counter terminates the counting operation and holds a count value (Vcan=N) of the state of the moment. The held count value is used as a digital value representing an offset voltage at the subsequent normal operation time of the input circuit 104.

With such a configuration example, the abovementioned flowchart of FIG. 8 is achieved, and offset reduction of the input circuit 104 can be achieved. Incidentally, the digital signal Vpole representing a sign of the offset voltage can latch the value of Vcon as it is and use the same, for example, like the configuration example of FIG. 12A. A cycle of the clock signal clk is defined according to a repetitive cycle of the "auto-zeroing operation" and the "normal amplifying operation" of the detecting circuit block operation mode in FIG. 7 and setting can be performed such that the counter 1203 performs an adding and subtracting operation during the "normal amplifying operation" only one time.

The input circuit block 102 of FIG. 13 includes an input circuit 104 and an adder-subtractor circuit block 105. Input signals Vinp and Vinn of the input circuit 104 are inputted into gate terminals of MOS transistors M21 and M22, respectively, and a current produced by a MOS transistor M23 for constant current generation is separated in two according to a difference voltage between the input signals to flow into two load resistors R21 and R22. Output signals Vop and Von output amplitudes corresponding to products of the currents and the load resistances R21 and R22. At this time, an offset voltage is generated due to variations in device characteristic of the MOS transistors M21 and M22 and the load resistances R21 and R22, but the offset voltage can be reduced in the adder-subtractor circuit block 105 described below.

The adder-subtractor circuit block 105 is configured such that circuit blocks where combinations of a plurality of MOS transistors for constant current generation Mp1 to MpN and Mn1 to MnN and a plurality of switches SWp_1 to SWp_N and SWn_1 to SWn_N are connected to output terminals of the input circuit 104 in parallel, the circuit blocks being connected to a P pole 1301 and an N pole 1302, respectively. When a positive offset voltage is generated, the amount of current flowing in the load resistance R22 is increased by adjusting the number of the switches SWp_1 to SWp_N to be turned to 'H' according to the magnitude of the positive offset voltage, so that the output level of the output signal Vop is decreased and the offset voltage is reduced. On the other hand, when a negative offset voltage is generated, the amount of current flowing in the load resistance R21 is increased by adjusting the number of the switches SWn_1 to SWn_N to be turned to 'H' according to the magnitude of the negative offset voltage, so that the output level of the output signal Von is decreased and the offset voltage is reduced.

By performing control of the switches according to the bit information of the register 402, offset reduction of the input circuit 104 can be achieved. Incidentally, while the MOS transistors are used in FIG. 13, it is clear that the offset reduction can be also achieved using bipolar transistors.

The effects obtained by typical aspects of the present invention will be briefly summarized below.

(1) In an input circuit for high-speed serial transmission between LSIs or the like, since an offset voltage generated due to variation in device characteristic can be reduced, transmission quality can be prevented from degrading due to influence of an offset voltage even if the amplitude of a received signal is small.

(2) Since the configuration in which an offset voltage of an input circuit is directly detected is used as means for reducing an offset voltage of an input circuit, high-precision variation compensation in a short time can be made possible. Also, at this time, since an amplifier with a low offset such as, for example, an Auto-Zero amplifier is used as means for detecting an offset voltage, further high precision can be achieved.

(3) Since means for holding a compensation signal for reducing an offset voltage of an input circuit as a digital signal is provided, it is possible to continuously perform signal amplification of a low offset voltage for a long time period.

In the foregoing, the invention made by the inventors of the present invention has been concretely described based on the embodiments. However, it is needless to say that the present invention is not limited to the foregoing embodiments and various modifications and alterations can be made within the scope of the present invention.

In the abovementioned fourth embodiment, for example, the fact has been described that a normal operation can be performed for a long time period by performing a single offset voltage detecting operation because the detected offset voltage is held as a digital value, but this is not an essential condition. For example, in a signal transmission in a long-distance communication device using an optical fiber, such as burst transmission, there are a period where signal reception is performed and a period where signal reception is not performed. In a system in which signal reception is not always required in this manner, a detecting operation of an offset voltage can be performed again utilizing the period where signal reception is not performed. As a result, even if the value of an offset voltage varies due to change of device characteristics of a semiconductor according to temperature change or fluctuation of power source voltage, variation compensation corresponding to the change can be made possible.

The low offset input circuit of the present embodiments is an effective technique as means for preventing degradation of transmission quality in such a system in which influence of an offset voltage generated due to variation in device characteristic of a receiver circuit cannot be disregarded with respect to the amplitude of a received signal as a signal receiver circuit in high-speed serial signal transmission between LSIs within an information processing apparatus such as, for example, a computer or a network apparatus. Moreover, it can be used to a signal receiver circuit of an electric signal portion of a system such as Ethernet (Registered Trademark) signal transmission devices utilizing an optical transmission technique, an amplifier for tape drive requiring a wideband signal amplification with a low offset voltage, and the like.

What is claimed is:

1. A low offset input circuit mounted on a receiver circuit of a high-speed transmission system that includes a transmitter circuit, the receiver circuit, and a transmission line that transmits a transmission signal from the transmitter circuit to the receiver circuit, the low offset input circuit comprising:

an input circuit that receives differential transmission signals from the transmission line at an input node and amplifies the transmission signals to generate first differential output signals;

an adder-subtractor circuit unit that generates second differential output signals at an output node by performing addition or subtraction of a first offset voltage to the first differential output signals, the adder-subtractor circuit unit including an adjusting voltage generating circuit unit that generates the first offset voltage to correspond to a value of a digital setting signal at a predetermined resolution received by the adder-subtractor circuit;

a first switch coupled to the input node of the input circuit and configured to cause the input circuit to amplify only an offset component of the input circuit when operated in an ON state;

a second switch having a first end and a second end, the first end being coupled with the output node of the adder-subtractor circuits; and an offset voltage compensating circuit block that detects an offset voltage of the input circuit using the second differential output signals when the first switch and the second switch are operated in an ON state, the offset voltage compensating circuit block including a detecting circuit unit and an adjusting and holding circuit unit that holds the detected offset voltage as the value of the digital setting signal, and wherein the detecting circuit unit includes an amplifier unit that amplifies the second differential output signals to perform offset reduction of the amplifier unit and a comparator circuit that performs a binary determination of the second differential output signals amplified by the amplifier unit and outputs a result of the binary determination to the adjusting and holding circuit unit, wherein the amplifier unit includes a third switch having a first end coupled to the second end of the second switch, a first amplifier, a fourth switch having a first end connected to an output node of the first amplifier and a second end connected to a capacitor that accumulates an offset voltage of the first amplifier during an auto-zeroing operation time period in which the third and fourth switches are switched to first states, and an adder-subtractor that subtracts the offset voltage accumulated in the capacitor from the second differential output signals that are input from the third switch to the first amplifier to cancel an offset voltage of the first amplifier during a normal operation time period in which the third and fourth switches are switched to second states, and wherein the adjusting and holding circuit unit monitors the result of the binary determination output by the comparator circuit to set the value of the digital setting signal to indicate the detected offset voltage of the input circuit and performs feedback of the digital setting signal to the adder-subtractor circuit unit.

2. The low offset input circuit according to claim 1, wherein the high-speed transmission system is a transmission system of giga (bps) level or higher.

3. The low offset input circuit according to claim 1, wherein the amplifier unit repeats the auto-zeroing operation time period and the normal operation time period alternately, and the adjusting and holding circuit unit searches for and holds the value of the digital setting signal while the amplifier unit is operating during the normal operation time period when the first switch and the second switch are operated in the ON state.

4. The low offset input circuit according to claim 1, wherein a plurality of the input circuits, a plurality of the adder-subtractor circuit units, a plurality of the first switches, a plurality of the second switches, a plurality of the adjusting voltage generating circuit units, and a plurality of the adjusting and holding circuit units are respectively provided corresponding to a plurality of channels, the detecting circuit unit is commonly provided to the plurality of channels, and the low offset input circuit further includes:

a first selecting unit which selects one from the plurality of the second switches associated with the plurality of channels to couple the selected second switch to the detecting circuit unit; and a second selecting unit which selects one from the plurality of the adjusting and holding circuit units associated with the plurality of channels to transmit the binary determination result of the detecting circuit unit to the selected adjusting and holding circuit unit.

5. A low offset input circuit mounted on a receiver circuit of a high-speed transmission system that includes a transmitter circuit, the receiver circuit, and a transmission line that transmits a transmission signal from the transmitter circuit to the receiver circuit, the low offset input circuit comprising:

a differential input circuit that receives a differential transmission signal from the transmission line and amplifies the differential transmission signal to generate a first differential output signal;

an adder-subtractor circuit unit that generates a second differential output signal at an output node by performing addition or subtraction of a first offset voltage to the first differential output signal, the adder-subtractor circuit unit including an adjusting voltage generating circuit unit that generates the first offset voltage to correspond to a value of a digital setting signal at a predetermined resolution received by the adder-subtractor circuit;

a first switch which short-circuits differential input nodes of the differential input circuit to each other when operated in an ON state;

a second switch having a first end and a second end, the first end being coupled with the output node of the adder-subtractor circuit;

a detecting circuit unit for detecting an offset voltage of the differential input circuit using the second differential output signal when the first switch and the second switch are operated in an ON state, the detecting circuit unit including an amplifier unit that amplifies the second differential output signal to perform offset reduction of the amplifier unit and a comparator circuit that performs a binary determination of the second differential output signal amplified by the amplifier unit to determine a polarity of the second differential output signal, and outputs a result of the binary determination; and an adjusting and holding circuit unit that monitors the result of the binary determination output by the comparator circuit to set the value of the digital setting signal to indicate the detected offset voltage of the input circuit, holds the detected offset voltage as the value of the digital setting signal when the polarity of the second differential output signal has been reversed, and performs feedback of the digital setting signal to the adder-subtractor circuit unit, wherein the amplifier unit includes:

a third switch having a first end coupled to the second end of the second switch, a first differential amplifier, a fourth switch having a first end connected to an output node of the first differential amplifier and a second end connected to a capacitor that accumulates an offset voltage of the first differential amplifier during an auto-zeroing operation time period in which the third and fourth switches are switched to first states, and an adder-subtractor that subtracts the offset voltage accumulated in the capacitor from the second differential output signal that is input from the third switch to the first differential amplifier to cancel an offset voltage of the first differential amplifier during a normal operation time period in which the third and fourth switches are switched to second states.

6. The low offset input circuit according to claim 5, wherein
the adder-subtractor of the amplifier unit includes a first adder-subtractor coupled to one of two differential input nodes of the first differential amplifier and a second adder-subtractor coupled to the other of the two differential input nodes of the first differential amplifier; and
the third switch includes a third switch pair that selects either of transmission of the second differential output signal to the first and second adder-subtractor or transmission of a predetermined fixed voltage to the first and second adder-subtractor.

7. The low offset input circuit according to claim 5, wherein the adjusting and holding circuit unit includes:
a transition detecting circuit that detects reverse of polarity of the second differential output signal from the result of the binary determination output by the comparator circuit; and
a counter unit that counts values of the digital setting signal until reverse of polarity of the second differential output signal from the result of the binary determination output by the comparator circuit is detected by the transition detecting circuit.

8. The low offset input circuit according to claim 5, wherein the differential input circuit includes:
a transistor pair which receives a differential transmission signal from the transmission line as a control input; and
a load circuit pair which converts a current flowing in the transistor pair to a voltage to generate the first differential output signal, and
wherein the adder-subtractor circuit unit and the adjusting voltage generating circuit unit include:
a plurality of first current circuits which add currents flowing in one load circuit of the load circuit pair; and
a plurality of second current circuits which add currents flowing in the other load circuit of the load circuit pair, and
wherein either of the plurality of first current circuits or the plurality of second current circuits are activated and the number of current circuits to be activated is determined according to a value of the digital setting signal.

9. A signal transmission system comprising a transmitter circuit, a receiver circuit, and a transmission line transmitting a transmission signal from the transmitter circuit to the receiver circuit,
wherein the receiver circuit includes:
an input circuit that receives differential transmission signals from the transmission line at an input node and amplifies the transmission signals to generate first differential output signals;
wherein the transmitter circuit includes:
a first switch coupled to the input node of the input circuit and configured to output only an offset component of the transmitter circuit to the receiver circuit when operated in an ON state; and
wherein the receiver circuit further includes:
an adder-subtractor circuit unit that generates second differential output signals at an output node by performing addition or subtraction of a first offset voltage to the first differential output signals, the adder-subtractor circuit unit including an adjusting voltage generating circuit unit that generates the first offset voltage to correspond to a value of a digital setting signal at a predetermined resolution received by the adder-subtractor circuit;
a second switch having a first end and a second end, the first end being coupled with the output node of the adder-subtractor circuit;
a detecting circuit unit for detecting an offset voltage of the input circuit using the second differential output signals when the first switch and the second switch are operated in an ON state, the detecting circuit unit including an amplifier unit that amplifies the second differential output signals to perform offset reduction of the amplifier unit and a comparator circuit that performs a binary determination of the second differential output signal amplified by the amplifier unit and outputs a result of the binary determination; and
an adjusting and holding circuit unit that monitors the result of the binary determination output by the comparator circuit to set the value of the digital setting signal to indicate the detected offset voltage of the input circuit holds the detected offset voltage as the value of the digital setting signal when the binary determination result transits, and performs feedback of the digital setting signal to the adder-subtractor circuit unit, and
wherein the amplifier unit includes a third switch having a first end coupled to the second end of the second switch, a first amplifier, a fourth switch having a first end connected to an output node of the first amplifier and a second end connected to a capacitor that accumulates an offset voltage of the first amplifier during an auto-zeroing operation time period in which the third and fourth switches are switched to first states, and an adder-subtractor that subtracts the offset voltage accumulated in the capacitor from the second differential output signals that are input from the third switch to the first amplifier to cancel an offset voltage of the first amplifier during a normal operation time period in which the third and fourth switches are switched to second states.

* * * * *